United States Patent
Sugita et al.

(10) Patent No.: US 6,943,041 B2
(45) Date of Patent: Sep. 13, 2005

(54) MAGNETORESISTIVE ELEMENT AND METHOD FOR PRODUCING THE SAME, AS WELL AS MAGNETIC HEAD, MAGNETIC MEMORY AND MAGNETIC RECORDING DEVICE USING THE SAME

(75) Inventors: Yasunari Sugita, Osaka (JP); Akihiro Odagawa, Tsuchiura (JP); Nozomu Matsukawa, Nara (JP); Yoshio Kawashima, Neyagawa (JP); Yasunori Morinaga, Suita (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/719,412

(22) Filed: Nov. 21, 2003

(65) Prior Publication Data

US 2004/0115839 A1 Jun. 17, 2004

Related U.S. Application Data

(63) Continuation of application No. PCT/JP03/05219, filed on Apr. 23, 2003.

(30) Foreign Application Priority Data

Apr. 23, 2002 (JP) ........................... 2002-120433

(51) Int. Cl.[7] .............................................. H01L 21/00
(52) U.S. Cl. .......................................... 438/3; 438/238
(58) Field of Search ............................ 438/3, 238–240, 438/381

(56) References Cited

U.S. PATENT DOCUMENTS

| | | | |
|---|---|---|---|
| 5,449,419 A | 9/1995 | Suzuki et al. | |
| 5,603,766 A | 2/1997 | Visokay et al. | |

(Continued)

FOREIGN PATENT DOCUMENTS

| | | |
|---|---|---|
| EP | 0 674 327 | 9/1995 |
| EP | 0 717 422 | 6/1996 |

(Continued)

OTHER PUBLICATIONS

Johnson. M, "Symposium on Spin Tunneling and Injection Phenomena", J. Appln. Phys. 79(8), Apr. 15, 1996, pp. 4724–4729.

(Continued)

*Primary Examiner*—H. Jey Tsai
(74) *Attorney, Agent, or Firm*—Merchant & Gould P.C.

(57) ABSTRACT

The present invention provides a method for producing a magnetoresistive element including a tunnel insulating layer, and a first magnetic layer and a second magnetic layer that are laminated so as to sandwich the tunnel insulating layer, wherein a resistance value varies depending on a relative angle between magnetization directions of the first magnetic layer and the second magnetic layer. The method includes the steps of: (i) laminating a first magnetic layer, a third magnetic layer and an Al layer successively on a substrate; (ii) forming a tunnel insulating layer containing at least one compound selected from the group consisting of an oxide, nitride and oxynitride of Al by performing at least one reaction selected from the group consisting of oxidation, nitriding and oxynitriding of the Al layer; and (iii) forming a laminate including the first magnetic layer, the tunnel insulating layer and a second magnetic layer by laminating the second magnetic layer in such a manner that the tunnel insulating layer is sandwiched by the first magnetic layer and the second magnetic layer. The third magnetic layer has at least one crystal structure selected from the group consisting of a face-centered cubic crystal structure and a face-centered tetragonal crystal structure and is (111) oriented parallel to a film plane of the third magnetic layer. According to this production method, it is possible to produce a magnetoresistive element with excellent properties and thermal stability.

5 Claims, 12 Drawing Sheets

U.S. PATENT DOCUMENTS

| | | |
|---|---|---|
| 5,753,131 A | 5/1998 | Choukh et al. |
| 5,801,984 A | 9/1998 | Parkin |
| 6,005,753 A | 12/1999 | Fontana et al. |
| 6,052,263 A | 4/2000 | Gill |
| 6,169,303 B1 | 1/2001 | Anthony |
| 6,201,259 B1 | 3/2001 | Sato et al. |
| 6,210,818 B1 | 4/2001 | Saito |
| 6,226,197 B1 | 5/2001 | Nishimura |
| 6,312,840 B1 | 11/2001 | Kumagai et al. |
| 6,387,548 B1 | 5/2002 | Hasegawa et al. |
| 6,418,001 B1 | 7/2002 | Nakatani |
| 6,473,960 B1 | 11/2002 | Schwartz et al. |
| 6,528,326 B1 | 3/2003 | Hiramoto et al. |
| 6,552,882 B1 | 4/2003 | Hayashi |
| 6,583,969 B1 | 6/2003 | Pinarbasi |
| 2001/0053053 A1 | 12/2001 | Saito et al. |
| 2002/0039264 A1 | 4/2002 | Ohsawa et al. |
| 2002/0047145 A1 | 4/2002 | Nickel |
| 2002/0126422 A1 | 9/2002 | Westwood |
| 2003/0197984 A1 * | 10/2003 | Inomata et al. .......... 360/324.2 |

FOREIGN PATENT DOCUMENTS

| | | |
|---|---|---|
| EP | 0 871 231 | 10/1998 |
| JP | 10-162326 | 6/1998 |
| JP | 11-266043 | 9/1999 |
| JP | 2000-020922 | 1/2000 |
| JP | 2000-067418 | 3/2000 |
| JP | 2000-068569 | 3/2000 |
| JP | 2000-132961 | 5/2000 |
| JP | 2000-187816 | 7/2000 |
| JP | 2001-188435 | 7/2000 |
| JP | 2001-236613 | 8/2001 |
| JP | 2002-171012 | 6/2002 |
| JP | 2002-204004 | 7/2002 |
| WO | 00/74154 | 12/2000 |
| WO | 02/088765 | 11/2002 |

OTHER PUBLICATIONS

Ji Hyung Yu et al. "Magnetic Tunnel Junctions with High Magnetoresistance and Small Bias Voltage Dependence Using Expitaxial NiFe (111) Ferromagnetic Bottom Electrodes", Journal of Applied Physics, vol. 93, No. 10, pp. 8555–8557, May 15, 2003.

Koichiro Inomata, MRAM Technology Progress and Prospect Materials Integration vol. 13, No. 12, P13–18, 2000 (Japanese only).

T.Miyazaki et al., "Giant Magnetic Tunneling Effect in Fe/$Al_2O_3$/Fe Junction", Journal of Magnetism and Magnetic Materials, 139 (1995) L231–L234.

Ping Shang et al., "High–resolution electron microscopy study of tunneling junctions with AlN and AlOn barriers", Journal of Applied Physics, vol. 89, No. 11, pp. 6874–6876, Jun. 1, 2001.

Yasunari Sugita et al., "Tunneling Magnetoresistance Enhancement for Pt–Added Magnetic Tunnel Junctions", Japanese Journal of Applied Physics, vol. 41, No. 10A, pp. L1072–L1074, Oct. 1, 2002.

Nozomu Matsuka et al., "Thermally stable exchange–biased magnetic tunnel junctions over 400° C" Applied Physics Letter, vol. 81, No. 25, pp. 4784–4786, Dec. 16, 2002.

* cited by examiner

MAGNETORESISTIVE ELEMENT AND METHOD FOR PRODUCING THE SAME, AS WELL AS MAGNETIC HEAD, MAGNETIC MEMORY AND MAGNETIC RECORDING DEVICE USING THE SAME

BACKGROUND OF THE INVENTION

1. Field of the Invention

The present invention relates to methods for producing magnetoresistive elements. The invention also relates to magnetoresistive elements, as well as magnetic heads, magnetic memories and magnetic recording devices, which are magnetic devices using the same.

2. Description of the Related Art

With the recent developments in advanced communication networks, there is a demand for devices capable of handling a large volume of information at high speeds. For example, as large-capacity, high-speed devices, expectations are growing for magnetic heads and magnetic memories (MRAMs) that utilize the tunneling magnetoresistance effect (TMR effect).

The TMR effect is the phenomenon in which the resistance value varies depending on a relative angle between the magnetization directions of a pair of magnetic layers laminated with a tunnel insulating layer interposed therebetween. Magnetoresistive elements (TMR elements) utilizing this phenomenon have a ratio of change in the magnetoresistance (MR ratio) in a minute magnetic field that is by far larger than elements utilizing the anisotropic magnetoresistance effect (AMR effect) or the giant magnetoresistance effect (GMR effect). Therefore, extensive developments are under way to apply TMR elements to next-generation magnetic heads and MRAMs.

Each of the layers constituting a TMR element is extremely thin, and is on the order of several nm to several tens of nm. In order to achieve a TMR element with excellent magnetoresistance properties (MR properties), it is important to control these layers. Particularly, the state of a tunnel insulating layer is considered to have a significant effect on the MR properties of the element.

For example, in the case of using a TMR element for a device such as a magnetic head, it is preferable to realize a large MR ratio and minimize (e.g., 10 $\Omega \cdot \mu m^2$ or less) the junction resistance value (resistance value per unit area when a current is supplied in a direction perpendicular to the film plane direction of the element). When the junction resistance value is small, it is possible to suppress, for example, the generation of shot noise, which is the phenomenon of electrons being transmitted randomly through the tunnel insulating layer (shot noise causes a reduction in the S/N (signal-to-noise ratio) of the element). The junction resistance value can be reduced by, for example, decreasing the thickness of the tunnel insulating layer. However, simply decreasing the thickness of the tunnel insulating layer possibly may reduce the resulting MR ratio. In general, the interface between the tunnel insulating layer and a magnetic layer in contact therewith is not completely smooth, exhibiting a roughness at the atomic level in the sub-nanometer to several nanometer range. That is, regions in which the thickness is locally large and regions in which the thickness is locally small are present in the tunnel insulating layer. Therefore, there is the possibility that with a decrease in the thickness of the tunnel insulating layer, a leakage current may be generated in the region in which the thickness is locally small. Since a leakage current does not contribute to the MR effect, this causes a reduction in the MR ratio, although the apparent junction resistance value is reduced.

In addition, TMR elements have the problem that the resulting MR ratio decreases with an increase in the applied bias voltage. In the case of a MRAM using TMR elements, for example, a bias voltage of about 400 mV generally is applied. In this state, the resulting MR ratio is about half of that in the state in which no bias voltage is applied. Such "bias voltage dependence of the MR ratio" is considered to be attributed to, for example, lattice defects in the tunnel insulating layer, impurities contained in the tunnel insulating layer, elementary excitations on the interface between the tunnel insulating layer and the magnetic layer and mismatches in the band structure. Among them, lattice defects in the tunnel insulating layer, mismatches in the band structure and the like are believed to be due partly to a roughness on the interface between the tunnel insulating layer and the magnetic layer.

In the case of using TMR elements for devices such as magnetic heads and MRAMs, the elements are required to have thermal stability capable of withstanding the process of manufacturing the devices. For example, heat treatment at about 200° C. to 300° C. is necessary in the manufacturing process of the elements themselves. When used for magnetic heads, the elements need to be stable at the operating environment temperature (e.g., about 120° C. to 170° C.) of the magnetic heads. Research is also carried out to fabricate MR elements on CMOSs for use as MRAM devices. Heat treatment at even higher temperatures (e.g., 400° C. to 450° C.) is necessary in the manufacturing process of CMOSs.

However, the MR properties of conventional TMR elements tend to deteriorate by heat treatment at about 300° C. to 350° C. This is presumably due to the diffusion of impurities into the tunnel insulating layer, an increase in the interface roughness and the like. The tunnel insulating layer has a very small thickness, so that it is susceptible to such effect. In order to apply TMR elements to devices such as magnetic heads and MRAMs, it is therefore important to develop TMR elements whose MR properties tend less to deteriorate when the temperature of the elements is increased by heat treatment and the like.

SUMMARY OF THE INVENTION

In view of this situation, it is an object of the present invention to provide a TMR element excellent in properties and thermal stability, and a method for producing such a TMR element. It is also an object of the present invention to provide a magnetic head, a magnetic memory and a magnetic recording device that are excellent in properties and thermal stability. It should be noted that in the present specification, the TMR element simply may be referred to as "magnetoresistive element" or "MR element".

In order to achieve the forgoing objects, the present invention provides a method for producing a magnetoresistive element including a tunnel insulating layer, and a first magnetic layer and a second magnetic layer that are laminated so as to sandwich the tunnel insulating layer, wherein a resistance value varies depending on a relative angle between magnetization directions of the first magnetic layer and the second magnetic layer. The method includes the steps of:

(i) laminating a first magnetic layer, a third magnetic layer and an Al layer successively on a substrate;

(ii) forming a tunnel insulating layer containing at least one compound selected from the group consisting of an oxide, nitride and oxynitride of Al by performing at least one reaction selected from the group consisting of oxidation, nitriding and oxynitriding of the Al layer; and (iii) forming a laminate including the first magnetic layer, the tunnel insulating layer and a second magnetic layer by laminating the second magnetic layer in such a manner that the tunnel insulating layer is sandwiched by the first magnetic layer and the second magnetic layer, wherein the third magnetic layer has at least one crystal structure selected from the group consisting of a face-centered cubic crystal structure and a face-centered tetragonal crystal structure and is (111) oriented parallel to a film plane of the third magnetic layer. The method for determining whether the layer is (111) oriented parallel is described later in the examples.

In the production method of the present invention, the third magnetic layer may include a magnetic material containing at least one element selected from the group consisting of Fe, Co and Ni.

In the production method of the present invention, the magnetic material may have a composition represented by the formula $Fe_xCo_y$, where x and y are values satisfying the following equations:

$x+y=1$ $0.05 \leq x \leq 0.3$ $0.7 \leq y \leq 0.95$

In the production method of the present invention, the magnetic material may have a composition represented by the formula $Fe_{x'}Ni_{y'}$, where x' and y' are values satisfying the following equations:

$x'+y'=1$ $0 \leq x' \leq 0.7$ $0.3 \leq y' \leq 1$

In the production method of the present invention, the magnetic material further may contain at least one element selected from the group consisting of Rh, Pd, Ag, Ir, Pt and Au.

In the production method of the present invention, the magnetic material may have a composition represented by the formula $M_pZ_q$, where M is at least one element selected from the group consisting of Fe, Co and Ni, Z is at least one element selected from the group consisting of Rh, Pd, Ag, Ir, Pt and Au, and p and q are values satisfying the following equations:

$p+q=1$ $0.6 \leq p \leq 0.99$ $0.01 \leq q \leq 0.4$

In the production method of the present invention, an antiferromagnetic layer may be laminated between the substrate and the first magnetic layer in the step (i).

The production method of the present invention further may include the step of: (a) heat treating the laminate, after the step (iii).

Next, the present invention provides a magnetoresistive element including: a tunnel insulating layer containing at least one compound selected from the group consisting of an oxide, nitride and oxynitride of Al; a first magnetic layer and a second magnetic layer that are laminated so as to sandwich the tunnel insulating layer; and a third magnetic layer disposed between the first magnetic layer and the tunnel insulating layer. A resistance value varies depending on a relative angle between magnetization directions of the first magnetic layer and the second magnetic layer, and the third magnetic layer has at least one crystal structure selected from the group consisting of a face-centered cubic crystal structure and a face-centered tetragonal crystal structure and is (111) oriented parallel to a film plane of the third magnetic layer.

In the magnetoresistive element of the present invention, the third magnetic layer may include a magnetic material containing at least one element selected from the group consisting of Fe, Co and Ni.

In the magnetoresistive element of the present invention, the magnetic material may have a composition represented by the formula $Fe_xCo_y$, where x and y are values satisfying the following equations:

$x+y=1$ $0.05 \leq x \leq 0.3$ $0.7 \leq y \leq 0.95$

In the magnetoresistive element of the present invention, the magnetic material may have a composition represented by the formula $Fe_{x'}Ni_{y'}$, where x' and y' are values satisfying the following equations:

$x'+y'=1$ $0 \leq x' \leq 0.7$ $0.3 \leq y' \leq 1$

In the magnetoresistive element of the present invention, the magnetic material further may contain at least one element selected from the group consisting of Rh, Pd, Ag, Ir, Pt and Au.

In the magnetoresistive element of the present invention, the magnetic material may have a composition represented by the formula $M_pZ_q$, where M is at least one element selected from the group consisting of Fe, Co and Ni, Z is at least one element selected from the group consisting of Rh, Pd, Ag, Ir, Pt and Au, and p and q are values satisfying the following equations:

$p+q=1$ $0.6 \leq p \leq 0.99$ $0.01 \leq q \leq 0.4$

The magnetoresistive element of the present invention further may include an antiferromagnetic layer.

In the magnetoresistive element of the present invention, the antiferromagnetic layer is disposed on a side opposite a plane of the first magnetic layer facing the tunnel insulating layer and is (111) oriented parallel to a film plane of the antiferromagnetic layer.

Next, the present invention provides a magnetic head including the above-described magnetoresistive element and a shield for limiting an introduction of a magnetic field other than a magnetic field to be detected by the magnetoresistive element to the magnetoresistive element.

Alternatively, the magnetic head of the present invention also may include the above-described magnetoresistive element and a magnetic flux guiding portion for guiding a magnetic field to be detected by the magnetoresistive element to the magnetoresistive element.

Next, the present invention provides a magnetic memory that may include the above-described magnetoresistive element and an information recording conductive line for recording information on the magnetoresistive element and an information reading conductive line for reading the information.

In the magnetic memory of the present invention, a plurality of the magnetoresistive elements may be disposed in the form of a matrix.

Next, the present invention provides a magnetic recording device including one of the above-described magnetic heads and a magnetic recording medium capable of reading magnetic information with the magnetic head.

DESCRIPTION OF THE PREFERRED EMBODIMENTS

Figure 1A:
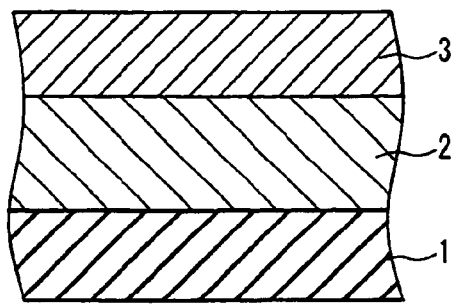
FIGS. 1A to 1E are schematic cross-sectional views showing the respective steps of an example of the method of producing a magnetoresistive element according to the present invention.

Embodiments of the present invention are described below with reference to the drawings. In the following embodiments, the same reference numerals are applied to the same parts, and redundant explanations are thus omitted in some cases.

First, the method for producing a MR element of the present invention is described.

According to the method of producing a MR element of the present invention, it is possible to obtain a TMR element with excellent properties and thermal stability.

Figure 1B:
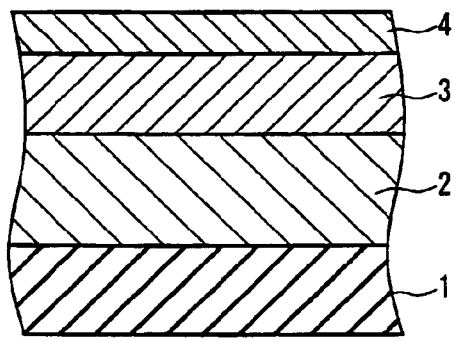
Figure 1C:
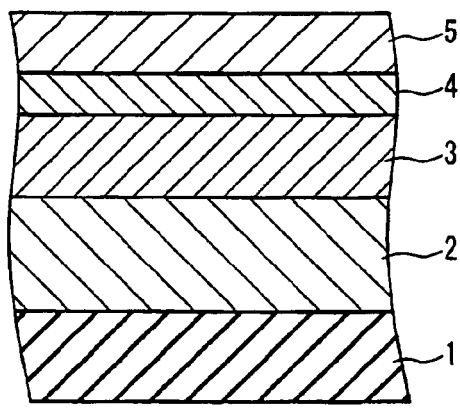

FIGS. 1A to 1E show an example of the method of producing a MR element of the present invention. First, as shown in FIGS. 1A to 1C, a lower electrode layer 2, a first magnetic layer 3, a third magnetic layer 4 and an Al layer 5 are laminated successively on a substrate 1 (step (i)). At this time, the third magnetic layer (smooth interface layer) 4 is a layer that has at least one crystal structure selected from the group consisting of a face-centered cubic crystal (fcc structure) and a face-centered tetragonal crystal (fct structure) and that is (111) oriented parallel to its own film plane. Accordingly, it is possible to achieve an Al layer 5 having the (111) orientation with respect to its own film plane by laminating the Al layer 5 on the third magnetic layer 4. In general, Al is most stable and dense when its crystal structure is the fcc structure having the (111) orientation. Therefore, it is possible to achieve an Al layer 5 having a more stable and dense crystal structure than in the case in which the Al layer 5 is directly laminated on the first magnetic layer 3 without providing the third magnetic layer 4.

Figure 1D:
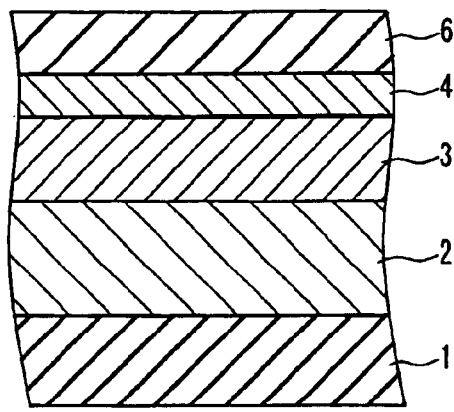

Next, as shown in FIG. 1D, a tunnel insulating layer 6 containing an Al oxide (Al—O) is formed by oxidizing the Al layer 5 (step (ii)). As described above, because of the presence of the third magnetic layer 4, the Al layer 5 has the fcc structure with the (111) orientation, as well as a stable and dense crystal structure. Therefore, the tunnel insulating layer 6 formed by oxidizing the Al layer 5 can be a dense tunnel insulating layer having few crystal defects. It should be noted that when a composition is denoted with hyphens, such as in the case of "Al—O", in this specification, there is no particular limitation on the composition ratio of the contained elements.

Figure 1E:
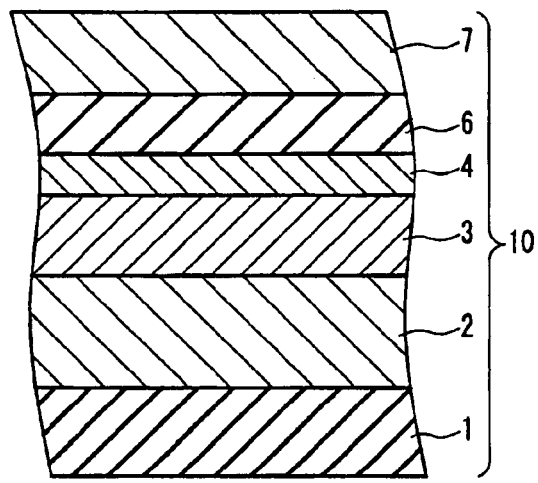

Next, as shown in FIG. 1E, a second magnetic layer 7 is laminated such that the tunnel insulating layer 6 is sandwiched by the first magnetic layer 3 and the second magnetic layer 7. In this manner, a laminate 10 including the first magnetic layer 3, the tunnel insulating layer 6 and the second magnetic layer 7 is formed (step (iii)). Thereafter, for example, an upper electrode layer may be laminated further, or micro-fabrication may be performed, as required. As described above, the tunnel insulating layer 6 can be a dense tunnel insulating layer having few crystal defects, so that it is possible to obtain a TMR element with excellent properties and thermal stability.

Figure 2A:
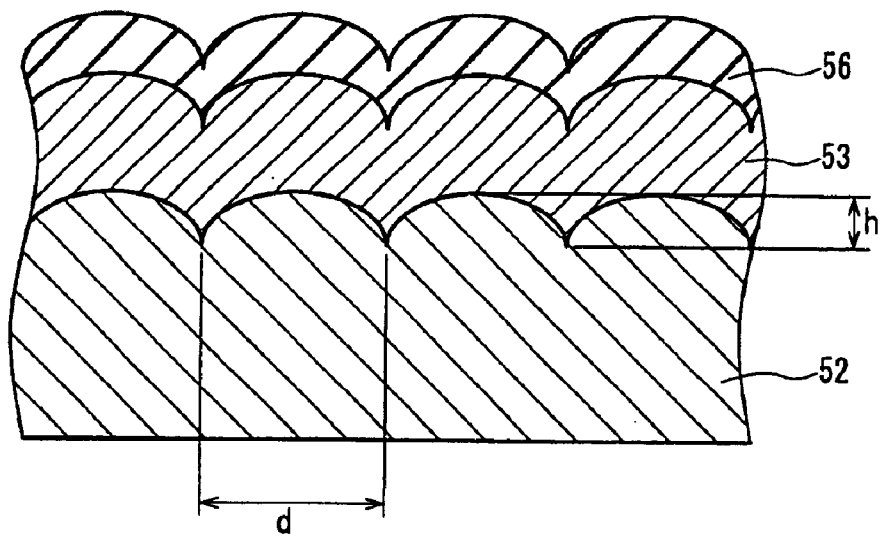
FIGS. 2A and 2B are schematic cross-sectional views for illustrating the difference between a conventional magnetoresistive element and the magnetoresistive element of the present invention.

In addition, the following effects seem to be achieved by laminating the third magnetic layer 4:

FIG. 2A is a schematic cross-sectional view showing an example of a conventional TMR element. In general, the surface of a lower electrode layer 52 has the roughness reflecting a roughness of the substrate surface or the crystal grain boundaries of the lower electrode layer itself (taking the periodicity in the film plane direction with respect to the film plane of the lower electrode layer, i.e., with respect to the film plane of the element as "d" and the height of the projections in a direction perpendicular to the film plane as "h"). When a magnetic layer 53 is laminated on such a lower electrode layer 52, and a tunneling insulating layer 56 is formed, the surface of the magnetic layer 53, that is, the interface between the magnetic layer 53 and the tunnel insulating layer 56 will have the same roughness. Moreover, the same roughness results on the surface of the tunnel insulating layer 56 itself. For this reason, it is difficult to form the tunnel insulating layer 56 as a dense tunnel insulating layer with few crystal defects, resulting in the possibility that its properties and the thermal stability of the element may deteriorate. Although not explicitly shown in FIG. 2A, a roughness attributed to the atomic steps of the magnetic layer 53 itself also can be caused, so that there is the possibility that a roughness that is more minute than the periodicity d and the height h shown in FIG. 2A further may be caused on the interface between the magnetic layer 53 and the tunnel insulating layer 56. In the descriptions of the method for producing a MR element of the present invention, "surface" means the face of each of the layers of the element that is on a side opposite to the substrate.

Figure 2B:
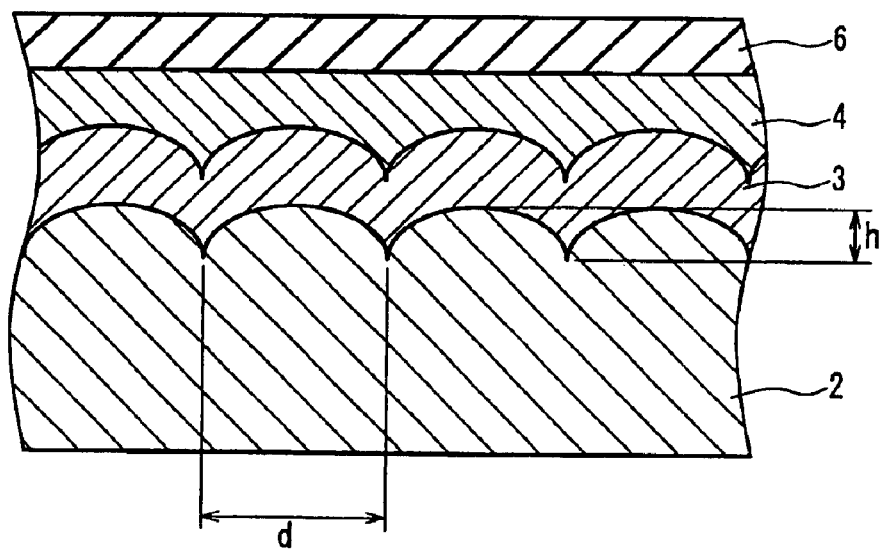

On the other hand, in the TMR element of the present invention, the third magnetic layer 4 is disposed between the tunnel insulating layer 6 and the first magnetic layer 3, as shown in FIG. 2B (FIG. 2B is a schematic cross-sectional view showing an example of the TMR element of the present invention). As described above, the third magnetic layer has at least one crystal structure selected from the group consisting of the fcc structure and the fct structure and is (111) oriented parallel to its own film plane. Therefore, the surface can be smoothed to the order of the atomic size (order of sub-nanometer). Accordingly, the interface between the third magnetic layer 4 and the tunnel insulating layer 6 can be smoothed by laminating the third magnetic layer 4 on the first magnetic layer 3 and thereafter forming the tunnel insulating layer 6. The surface of the tunnel insulating layer 6 also can be smoothed, so that the interface between the second magnetic layer and the tunnel insulating layer 6 can be smoothed when the second magnetic layer is further laminated on the tunnel insulating layer 6. Accordingly, it is possible to obtain a TMR element with excellent properties and thermal stability.

As described above, in a TMR element obtained by the production method of the present invention, it is possible to achieve a dense tunnel insulating layer having few crystal defects, and the interface between the tunnel insulating layer and a magnetic layer in contact therewith can be smoothed, so that the thickness of the tunnel insulating layer can be reduced even further. Therefore, it is possible to obtain a TMR element having both a small junction resistance value and a large MR ratio.

Since a dense tunnel insulating layer having few crystal defects can be achieved, it is possible to obtain a TMR element with little loss in the MR ratio when a bias voltage is increased (i.e., with small bias voltage dependence).

Further, the (111) plane, which is the finest plane among the crystal planes of the third magnetic layer, is parallel to the film plane of the third magnetic layer (i.e., the film plane of the element), so that it is possible to suppress the thermal diffusion of the atoms from layers other than the tunnel insulating layer (e.g., the lower electrode layer, the first magnetic layer and others, and an antiferromagnetic layer in the case where the element contain the same) to the tunnel insulating layer. When the crystal grain size of the magnetic material contained in the first magnetic layer is increased by heat treatment and the like, it is also possible to inhibit such an effect from being exerted on the tunnel insulating layer. Accordingly, it is possible to obtain a TMR element with excellent thermal stability.

Although the Al layer 5 is oxidized in the example shown in FIG. 1, at least one reaction selected from the group consisting of oxidizing, nitriding and oxynitriding may be performed on the Al layer 5. It is possible to form a tunnel insulating layer 6 containing at least one compound selected from the group consisting of an oxide, nitride and oxynitride of Al, and in this case also a TMR element similar to the example shown in FIG. 1 can be obtained. The method for forming each layer, the method for oxidizing the Al layer and the like will be discussed later.

Next, the third magnetic layer 4 is described more specifically.

The third magnetic layer 4 has at least one crystal structure selected from the group consisting of the fcc structure and the fct structure and is (111) oriented parallel to its own film plane. There is no particular limitation on its composition, thickness and the like as long as it is magnetically coupled to the first magnetic layer 3.

The thickness of the third magnetic layer laminated in the step (i) is, for example, in the range of at least 1 nm and at most 10 nm, preferably, in the range of at least 1.5 nm and at most 5 nm. The surface roughness of the third magnetic layer 4 is, for example, in the range of at least 0.5 nm and at most 1 nm, using the arithmetical mean roughness $R_a$ prescribed in JIS (Japanese Industrial Standards) B 0601-1994. For example, "d" is in the range of at least 15 nm and at most 70 nm and "h" is in the range of at least 3 nm and at most 8 nm, using the periodicity d and the height h shown in FIGS. 2A and 2B. As discussed above, the surface roughness of the third magnetic layer 4 is reflected in the surface roughness on the interface between the third magnetic layer 4 and the tunnel insulating layer 6.

In the production method of the present invention, the third magnetic layer 4 may include a magnetic material containing at least one element selected from the group consisting of Fe, Co and Ni. In this case, the magnetic coupling between the first magnetic layer 3 and the third magnetic layer 4 can be strengthened further, so that it is possible to obtain a TMR element with better properties.

More specifically, in the production method of the present invention, the third magnetic layer 4 may include a magnetic material having a composition represented by the formula $Fe_xCo_y$. Alternatively, the third magnetic layer 4 may include a magnetic material having a composition represented by the formula $Fe_{x'}Ni_{y'}$. In these formulas, x, y, x' and y' are values satisfying the following equations:

$$x+y=1,\ 0.05 \leq x \leq 0.3,\ 0.7 \leq y \leq 0.95$$

$$x'+y'=1,\ 0 \leq x' \leq 0.7,\ 0.3 \leq y' \leq 1$$

It should be noted that in this specification, the values used for representing compositions are based on the atomic composition ratios, unless stated otherwise.

Such a magnetic material tends to have an fcc structure, and the third magnetic layer 4 thus can have the fcc structure with higher reliability in the step (i). Accordingly, it is possible to obtain a TMR element with better properties and thermal stability.

In the production method of the present invention, the third magnetic layer 4 may contain at least one element selected from the group consisting of Fe, Co and Ni, and at least one element selected from the group consisting of Rh, Pd, Ag, Ir, Pt and Au. Such a magnetic material has atomic radii of Rh, Pd, Ag, Ir, Pt and Au that are larger than those of Fe, Co and Ni, and is easily (111) oriented, so that the surface of the third magnetic layer 4 can be smoothed with higher reliability in the step (i). Moreover, since the energy state of the surface can be better stabilized as compared to a magnetic layer consisting only of at least one element selected from the group consisting of Fe, Co and Ni, it is possible to achieve a more stabilized and denser Al layer 5 in the step (i). Accordingly, it is possible to form a denser tunnel insulating layer 6 having fewer crystal defects in the step (ii).

Furthermore, since Rh, Pd, Ag, Ir, Pt and Au are less reactive with oxygen, nitrogen and the like, it is possible to thermally stabilize the third magnetic layer more effectively, thereby obtaining a MR element with better thermal stability. In addition, the selective oxidation (nitriding, oxynitriding) of the Al layer 5 can be performed in the step (ii), while preventing the oxidation (nitriding, oxynitriding) of the third magnetic layer 4 as much as possible, so that it is possible to obtain a TMR element with better properties.

In the production method of the present invention, the third magnetic layer 4 may include a magnetic material having a composition represented by the formula $M_pZ_q$, where M is at least one element selected from the group consisting of Fe, Co and Ni, Z is at least one element selected from the group consisting of Rh, Pd, Ag, Ir, Pt and Au, and p and q are values satisfying the following equations:

$$p+q=1, 0.6 \leq p \leq 0.99, 0.01 \leq q \leq 0.4$$

Inclusion of such a magnetic material in the third magnetic layer 4 makes it possible to obtain a TMR element with better properties and thermal stability.

Particularly, it is preferable that p and q satisfy the relations $p+q=1, 0.6 \leq p \leq 0.95, 0.05 \leq q \leq 0.4$, and it is more preferable that they satisfy the relations $p+q=1, 0.6 \leq p \leq 0.9, 0.1 \leq q \leq 0.4$. When q is greater than 0.5, the thickness of the third magnetic layer 4 may be at most 2 nm, for example. Since Rh, Pd, Ag, Ir, Pt and Au are nonmagnetic elements, there is the possibility that the MR properties of the element possibly may deteriorate if the thickness of the third magnetic layer is too large.

In the production method of the present invention, an antiferromagnetic layer may be laminated between the substrate and the first magnetic layer in the step (i). For instance, in the example shown in FIGS. 1A to 1E, an antiferromagnetic layer may be laminated between the lower electrode layer 2 and the first magnetic layer 3. Such a production method makes it possible to obtain a spin valve TMR element having one of the first magnetic layer 3 and the second magnetic layer 7 as a pinned magnetic layer and the other of these magnetic layers as a free magnetic layer. When an antiferromagnetic layer is laminated between the lower electrode layer and the first magnetic layer, an exchange coupling magnetic field is generated between the first magnetic layer and the antiferromagnetic layer. Accordingly, it is possible to obtain a spin valve TMR element having the first magnetic layer as a pinned magnetic layer (magnetic layer whose magnetization direction is fixed by the antiferromagnetic layer) and the second magnetic layer 2 as a free magnetic layer (magnetic layer whose magnetization can be rotated relatively easily with respect to the first magnetic layer). In addition, the thickness of the antiferromagnetic layer laminated in the step (i) is, for example, in the range of at least 5 nm and at most 50 nm.

In the case of a spin valve MR element, a relative angle between the magnetization directions of the pinned magnetic layer and the free magnetic layer can be changed more easily, so that it is possible to achieve a TMR element more suitable for devices operating with minute magnetic fields. Further, it is possible to achieve a smaller TMR element exhibiting a larger MR ratio.

There is no particular limitation on the material used for the antiferromagnetic layer, and antiferromagnetic alloys containing Mn (Mn-based antiferromagnetic alloys) may be used, for example. As the Mn-based antiferromagnetic alloys, for example, alloys may have a composition represented by the formula Z-Mn (where Z is at least one element selected from the group consisting of Pt, Pd, Ir, Fe, Ru and Rh). In particular, alloys having a composition of Fe—Mn, Rh—Mn, Ir—Mn, Pt—Mn, Pt—Pd—Mn, Ni—Mn and the like are preferable.

These antiferromagnetic alloys are likely to have the fcc structure or the fct structure, and tend to be (111) oriented parallel to their own film plane when used as the antiferromagnetic layer. Therefore, by laminating such an antiferromagnetic layer, it is possible to reduce the surface roughness of the substrate or the surface roughness of each layer attributed to the crystal grain boundaries of the lower electrode layer. Accordingly, it is possible to obtain a TMR element with better properties and thermal stability.

Particularly, during the lamination of the antiferromagnetic layer between the substrate and the first magnetic layer in the step (i), the antiferromagnetic layer may be laminated after laminating an underlayer of Ni—Fe, Pt or the like. Ni—Fe, Pt and the like are likely to have the fcc structure, so that the antiferromagnetic layer can have the fcc structure with higher reliability. Accordingly, it is possible to obtain a TMR element with better properties and thermal stability.

Additionally, since Pt—Mn, Pt—Pd—Mn, Ni—Mn and the like are changed into the fct structure by heat treatment at 250° C. or above, the exchange coupling magnetic field with the first magnetic layer can be improved further by heat treatment. Therefore, it is possible to obtain a TMR element with better properties. Alternatively, it is possible to laminate the antiferromagnetic layer on the second magnetic layer (i.e., on a side opposite to the substrate side of the tunnel insulating layer), instead of laminating it between the substrate and the first magnetic layer (i.e., instead of laminating it between the substrate and the tunnel insulating layer). In this case, it is possible to obtain a spin valve TMR element having the second magnetic layer as the pinned magnetic layer and the first magnetic layer as the free magnetic layer.

The other layers are described below.

There is no particular limitation on the thickness of the Al layer 5 laminated in the step (i). It may be set arbitrarily, depending on the required properties of the TMR element, and it is, for example, in the range of at least 0.1 nm and at most 10 nm. The thickness of the laminated Al layer 5 can be used directly as the thickness of the tunnel insulating layer 6.

There is no particular limitation on the materials used for the first magnetic layer 3 and the second magnetic layer 7 that are laminated in the step (i) and the step (iii), as long as they are magnetic materials exhibiting ferromagnetic properties. For example, magnetic materials made of Co, Fe, Ni, Co—Fe, Ni—Fe, Ni—Co—Fe or the like may be used. It is also possible, as required, to laminate a plurality of magnetic films made of different magnetic materials. The thickness of the first magnetic layer 3 and the second magnetic layer 7 that are laminated may be, for example, in the range of at least 1 nm and at most 20 nm.

In the case of producing a spin valve MR element, a magnetic material with excellent soft magnetic properties, for example, may be used for the magnetic layer serving as the free magnetic layer. More specifically, a permalloy (e.g., $Ni_{81}Fe_{19}$: composition ratio by wt %), $Co_{0.9}Fe_{0.1}$, $(Co_{0.9}Fe_{0.1})_{0.8}B_{0.2}$ or the like may be used, for example. A magnetic material with large magnetic anisotropy, for example, may be used for the magnetic layer serving as the pinned magnetic layer. More specifically, examples include $Co_{0.5}Fe_{0.5}$, $Co_{0.5}Pt_{0.5}$, $Fe_{0.5}Pt_{0.5}$. Alternatively, since the magnetization direction of the pinned magnetic layer can be fixed by the antiferromagnetic layer and the like in a spin valve TMR element, the above-described magnetic material with excellent soft magnetic properties may be used for the magnetic layer serving as the pinned magnetic layer.

One of the first magnetic layer 3 and the second magnetic layer 7 may include a laminated film structure (so-called laminated ferrimagnetic structure) in which a pair of magnetic films are laminated with a nonmagnetic film interposed therebetween. At this time, when the pair of magnetic films are magnetically coupled via the nonmagnetic film such that their magnetization directions are antiparallel with respect to each other, it is possible to reduce a leakage magnetic field generating from the end of the element, thereby obtaining a TMR element with better properties. Particularly, when the magnetic layer serving as the pinned magnetic layer includes the above-described laminated ferrimagnetic structure, it is possible to increase the magnetic anisotropy of the pinned magnetic layer further, that is, to achieve a pinned magnetic layer whose magnetization direction is less likely to change by the magnetic field that is applied from the outside to the element.

There is no particular limitation on the material used for the nonmagnetic film as long as it is a nonmagnetic material, and Ru, Cr, Cu or the like may be used, for example. The film thickness may be, for example, in the range of at least 0.4 nm and at most 1.5 nm. The magnetic film may be a film containing, for example, Fe, Co or Ni. The thickness of the magnetic film may be, for example, in the range of at least 1 nm and at most 10 nm.

There is no particular limitation on the substrate 1 as long as it is nonmagnetic, and Si, AlTiC, $Al_2O_3$ (e.g., sapphire) may be used, for example. The thickness may be, for example, in the range of at least 0.1 $\mu$m and at most 10 mm.

Additionally, in the example shown in FIGS. 1A to 1E, the lower electrode layer 2 is laminated on the substrate 1. There is no particular limitation on the material used for the lower electrode layer 2 as long as it is an electrically conductive material, and a low-resistance material (e.g., having a linear resistivity of 100 $\mu\Omega$cm or lower) such as Pt, Au, Cu, Ru, Al or TiN may be used, for example. It is also possible to laminate a plurality of films made of different materials. In the case of laminating an upper electrode layer, the material used for the upper electrode layer may be the same as that used for the lower electrode layer. There is no particular limitation on the thicknesses of the lower electrode layer and the upper electrode layer, and they may be in the range of at least 10 nm and at most 10 $\mu$m, for example.

In the production method of the present invention, it is possible, as required, to laminate layers other than the layers shown in FIGS. 1A to 1E. For example, an underlayer of Ta, Nb, Zr, Pt, Cr, Ni—Fe or the like may be laminated between the lower electrode layer 2 and the first magnetic layer 3 (between the lower electrode layer and the antiferromagnetic layer, in the case of laminating the antiferromagnetic layer). It is also possible to laminate a plurality of tunnel insulating layers. In the case of laminating a plurality of tunnel insulating layers, the above-described third magnetic layer may be laminated between at least one of the tunnel insulating layers and a magnetic layer on the substrate side that is adjacent thereto.

In the production method of the present invention, pulse laser deposition (PLD), ion beam deposition (IBD), sputtering using duster ion beam, RF, DC, electron cyclotron resonance (ECR), helicon, induction coupled plasma (ICP) or facing targets, molecular beam epitaxy (MBE) or ion plating, for example, may be used as the method for forming each of the layers constituting the TMR element. Other than these PVD processes, it is also possible to use CVD processes, plating processes or sol-gel processes.

In the production method of the present invention, for example, the following process may be used for the lamination and the subsequent oxidation of the Al layer in the step (i) and the step (ii). First, an Al layer is formed by a PVD process such as sputtering, MBE or IBD, using Al as the target. Next, a tunnel insulating layer made of Al—O may be formed by oxidizing the Al layer by natural oxidation, plasma oxidation, radical oxidation, ozone oxidation or the like.

Here, the natural oxidation is a process of oxidizing an Al layer in pure oxygen gas, in a mixed gas of pure oxygen gas and another gas (e.g., inert gas or rare gas) or in the atmosphere. In the case of oxidation in pure oxygen or in a mixed gas of pure oxygen and another gas, the partial pressure of oxygen may be, for example, in the range of at least $1 \times 10^{-2}$ Pa and at most $1 \times 10^5$ Pa. The oxidation time may be, for example, in the range of at least about 10 sec and at most about 100 min, and the temperature may be, for example, in the range of at least 10° C. and at most 100° C.

Radical oxidation is a process in which oxygen gas is dissociated into oxygen radicals having unpaired electrons with an RF coil, ECR plasma or the like, and only the neutral components of the generated oxygen radicals are utilized for oxidation. Plasma oxidation is a process in which oxygen gas is made into a plasma by substantially the same technique as that of the radical oxidation and the oxygen radical with a highly oxidative oxygen radical or ozone is used for oxidation. The degree of oxidation of an Al layer using these techniques can be controlled by adjusting the partial pressure of oxygen, the temperature, the time, the electric power used for generating radicals or plasma and the like. The partial pressure of oxygen may be, for example, in the range of at least 0.01 Pa and at most 10 Pa. The oxidation time may be, for example, in the range of at least about 1 sec and at most about 100 min, and the temperature may be, for example, in the range of at least 10° C. and at most 100° C. Under such conditions, it is possible to form a dense tunnel insulating layer with few crystal defects.

Additionally, in the case of nitriding or oxynitriding the Al layer, nitrogen gas or a mixed gas of oxygen gas and nitrogen gas may be used in place of oxygen gas in the above-described processes.

The production method of the present invention further may include the step of: (a) heat treating the laminate formed in the step (iii), after the step (iii). Since the oxidation state in the tunnel insulating layer can be made more uniform by performing heat treatment, it is possible to obtain a TMR element with better properties and thermal stability. The heat treatment may be performed at a temperature in the range of, for example, at least 150° C. and at most 500° C., in vacuum, under reduced pressure or in inert gas or rare gas. In the case of further laminating an upper electrode layer after the step (iii), it also may be performed either after or before such lamination.

In addition, it is also possible to obtain a TMR element with better properties and thermal stability by using a single crystal substrate as the substrate and a lower electrode layer epitaxially grown on the substrate, or by smoothing the surface of the lower electrode layer by a process such as chemical mechanical polishing (CMP). This is because the roughness on the interface between the third magnetic layer and the tunnel insulating layer can be smoothed more effectively.

Next, the MR element of the present invention is described.

Figure 3:
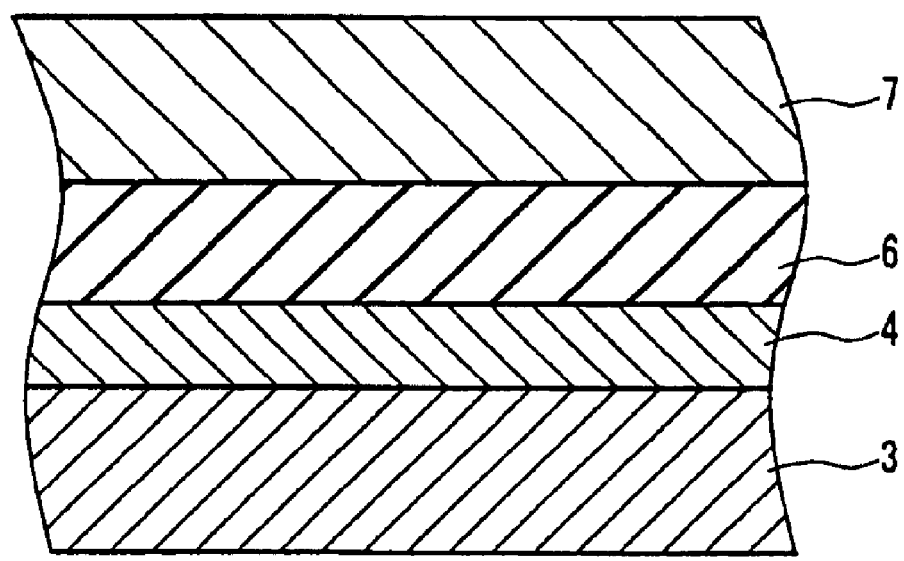
FIG. 3 is a schematic cross-sectional view showing an example of the magnetoresistive element of the present invention.

FIG. 3 shows an example of the MR element of the present invention. The MR element shown in FIG. 3 includes a tunnel insulating layer 6 containing at least one compound selected from the group consisting of an oxide, nitride and oxynitride of Al, a first magnetic layer 3 and a second magnetic layer 7 that are laminated so as to sandwich the tunnel insulating layer 6, and a third magnetic layer 4 disposed between the first magnetic layer 3 and the tunnel insulating layer 6. The resistance value varies depending on a relative angle between the magnetization directions of the first magnetic layer 3 and the second magnetic layer 7. Here, the third magnetic layer 4 has at least one crystal structure selected from the group consisting of a face-centered cubic crystal structure and a face-centered tetragonal crystal structure and is (111) oriented parallel to the film plane of the third magnetic layer 4.

Figure 4:
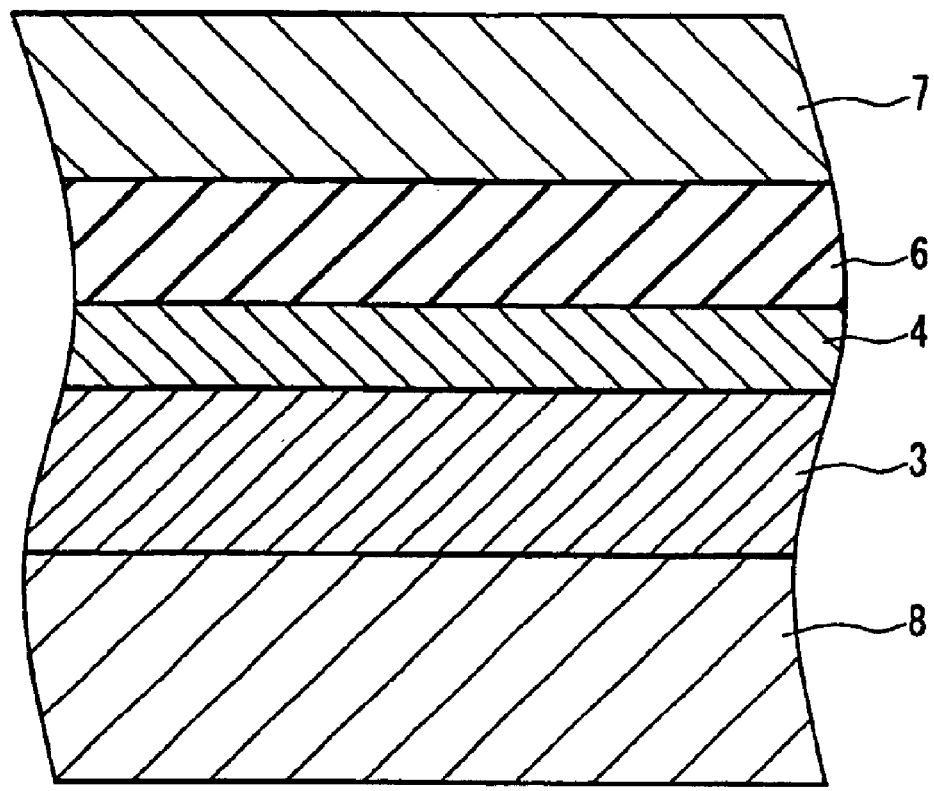
FIG. 4 is a schematic cross-sectional view showing another example of the magnetoresistive element of the present invention.

By forming such a MR element, it is possible to achieve a TMR element with excellent properties and thermal stability. Such a MR element can be obtained, for example, by the above-described production method of a MR element according to the present invention FIG. 4 shows another example of the MR element of the present invention. The MR element shown in FIG. 4 is a TMR element in which an antiferromagnetic layer 8 is further disposed on a side opposite to a plane of the first magnetic layer 3 that faces the tunnel insulating layer 6 in the MR element shown in FIG. 3. The further disposition of the antiferromagnetic layer 8 makes it possible to achieve a spin valve TMR element having the first magnetic layer 3 as the pinned magnetic layer and the second magnetic layer 7 as the free magnetic layer. Moreover, since the third magnetic layer 4 is disposed between the tunnel insulating layer 6 and the first magnetic layer 3, it is possible to achieve a TMR element with excellent properties and thermal stability.

In the case of the MR element shown in FIG. 4, the antiferromagnetic layer 8 also may be (111) oriented parallel to its own film plane. This can achieve a TMR element with better properties and thermal stability. Additionally, in the case of the examples shown in FIGS. 3 and 4, the antiferromagnetic layer 8 also may be disposed on the second magnetic layer 7. In this case, it is possible to achieve a spin valve TMR element having the second magnetic layer 7 as the pinned magnetic layer and the first magnetic layer 3 as the free magnetic layer.

In the case of the examples of the MR element shown in FIGS. 3 and 4, the material used for each layer, the thickness, the structure and the like of each layer may be the same as those described in the production method of a MR element of the present invention. This can achieve a TMR element having the effects described in the production method of a MR element of the present invention.

In the examples shown in FIGS. 3 and 4, the MR element further may include a lower electrode layer, an upper electrode layer, a substrate and the like. Also in this case, it is possible to achieve a TMR element with excellent properties and thermal stability, regardless of the surface roughness of the substrate, the state of the crystal grain boundaries of the lower electrode layer and the like. Conversely, the MR element does not need to include a lower electrode layer, an upper electrode layer, a substrate and the like, as shown in the examples of the below-described device using a MR element.

Next, devices using the MR element of the present invention are described.

In order to produce a magnetic device that contains a MR element and passes an electric current in a direction perpendicular to the film plane of the element, microfabrication may be performed by combining techniques commonly used for the semiconductor process or the manufacturing process of GMR heads. More specifically, it is possible to combine, for example, a physical or chemical etching process such as ion milling, reactive ion etching (RIE) or FIB (Focused Ion Beam) etching with a photolithography technique using a stepper for forming micropatterns, an electron beam (EB) process or the like.

Figure 5:
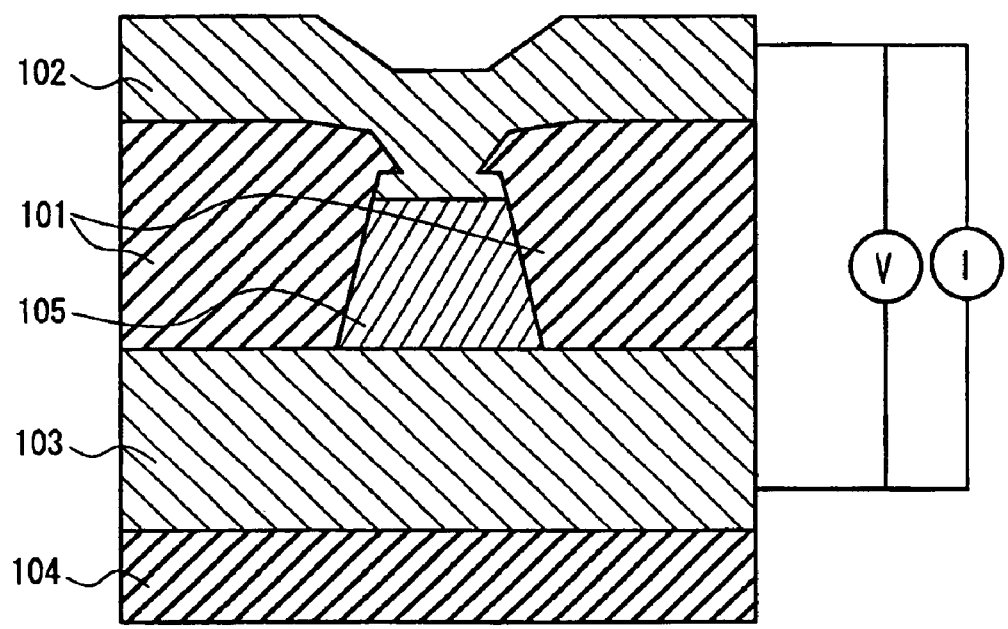
FIG. 5 is a cross-sectional view showing an example of the magnetoresistive element of the present invention that includes electrodes.

FIG. 5 shows an example of the MR element including electrodes that has been produced by such a method. In the MR element shown in FIG. 5, a lower electrode layer 103, a MR element 105, and an upper electrode layer 102 are laminated successively on a substrate 104. Further, an interlayer insulating film 101 is disposed around the MR element 105, as well as between the upper electrode layer 102 and the lower electrode layer 103. The interlayer insulating film 101 serves to prevent electric short circuits between the upper electrode layer 102 and the lower electrode layer 103. In the element shown in FIG. 5, it is possible to pass a current through the MR element 105 sandwiched by the upper electrode layer 102 and the lower electrode layer 103 and read the voltage. Accordingly, with a configuration of the element as shown FIG. 5, it is possible to pass a current in a direction perpendicular to the film plane of the MR element 105 and read the output. Additionally, CMP, duster ion beam etching or ECR etching, for example, may be used in order to smooth the surfaces of the electrode layers and the like.

As the materials of the upper electrode layer 102 and the lower electrode layer 103, the same materials as those of the above-described upper electrode layer and lower electrode layer may be used. For the interlayer insulating film 101, a material with excellent insulating properties, such as $Al_2O_3$ or $SiO_2$, may be used.

Figure 6:
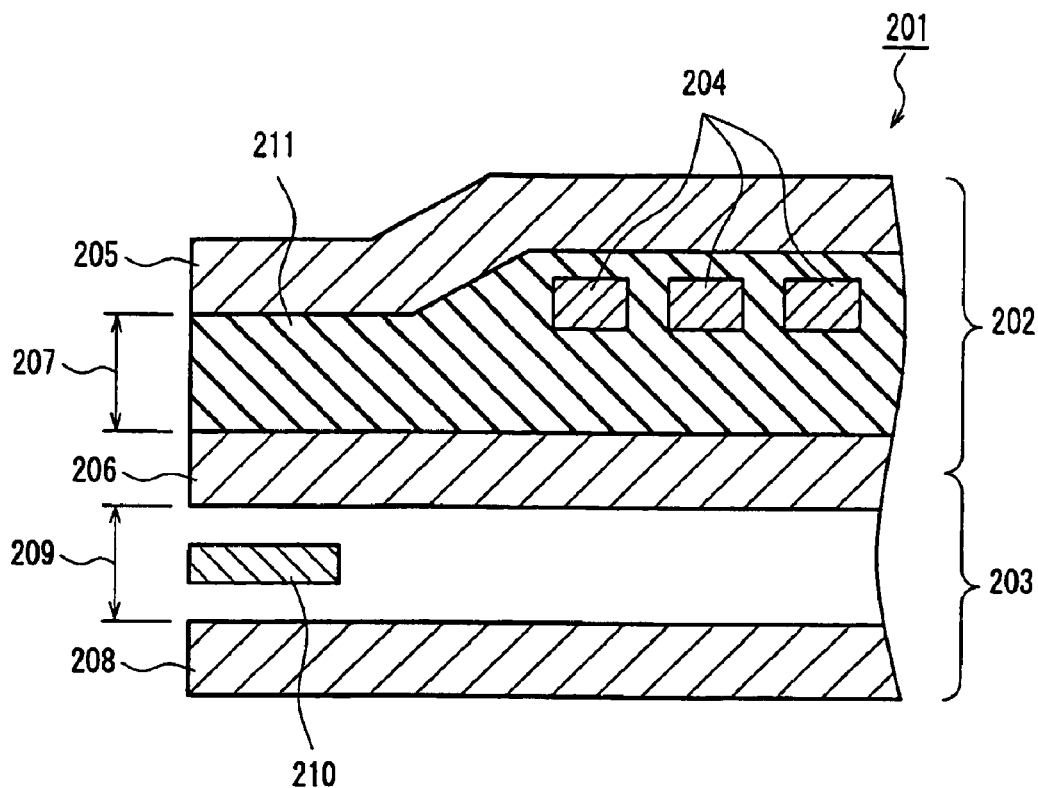
FIG. 6 is a cross-sectional view showing an example of the magnetic head of the present invention.

FIG. 6 shows an example of the magnetic head using the MR element of the present invention. FIG. 6 is a schematic view showing a shield type magnetic head provided with a shield for limiting the introduction of a magnetic field to the MR element other than a magnetic field to be detected by the MR element. It should be noted that a magnetic head 201 is shown in a cross-sectional view in FIG. 6 for facilitating the description.

The magnetic head 201 shown in FIG. 6 includes a pair of shields made of a magnetic substance (an upper shield 206 and a lower shield 208), and a MR element 210 is disposed in a read gap 209 formed by the above-described pair of shields.

The magnetic head 201 shown in FIG. 6 also includes a writing head portion 202 for recording and a reading head portion 203 for read. At the time of recording information, a current corresponding to the information to be recorded may be passed through coils 204. The magnetic flux generated by the current that has been passed through the coils 204 leaks out from a recording gap 207 provided between an upper recording core 205 and the upper shield 206, thereby performing the recording on a magnetic recording medium placed in the vicinity of the recording gap 207. In addition, an insulating portion 211 is formed between the upper recording core 205 and the upper shield 206. This insulating portion 211 is not always necessary, and may be formed as required.

On the other hand, the reading of information is performed as follows: the magnetic flux corresponding to the information recorded on the above-described recording medium acts on the MR element 210 through the read gap 209. Since the above-described action of the magnetic flux changes the resistance value of the MR element 210, this change may be detected. The magnetization directions of the free layer and the fixed layer of the MR element 210 may be, for example, in a substantially orthogonal relationship. If the MR element is not a spin valve MR element, the magnetic layer whose magnetization direction is relatively easier to change by an external magnetic field, of the pair of magnetic layers sandwiching the tunnel insulating layer, may be used as the free magnetic layer.

At this time, any magnetic field other than a magnetic field to be detected by the MR element (i.e., the above-described magnetic flux) is limited by the upper shield 206 and the lower shield 208 in the magnetic head shown in FIG. 6, so that it is possible to achieve a highly sensitive magnetic head. Further, inclusion of the above-described MR element of the present invention as the MR element 210 makes it possible to achieve a magnetic head with excellent properties and thermal stability.

Although not shown in FIG. 6, a lower electrode layer and an upper electrode layer are connected to the both film planes of the MR element 210. Here, the upper and lower electrode layers may be electrically insulated from the upper and lower shields by disposing an insulating layer or the like. Alternatively, the upper and lower electrode layers may be connected to the upper and lower shields to form a structure in which the upper and lower shields also serves as the upper and lower electrode layers. The sizes of the recording gap 207 and the read gap 209 are, for example, in the range of at least 0.01 $\mu$m and at most 10 $\mu$m.

As the materials of the upper shield 206 and the lower shield 208, common soft magnetic materials such as an alloy of Ni—Fe, Fe—Al—Si or Co—Nb—Zr may be used. Among them, soft magnetic materials with excellent magnetic permeability are preferable. For the insulating portion 211, a material with excellent insulating properties such as $Al_2O_3$, AlN or $SiO_2$ may be used.

In order to control the magnetic domain of the free magnetic layer in the MR element 210, it is also possible to apply a bias magnetic field to the element by sandwiching the MR element 210 by a magnetic film made of a material with high coercive force such as an alloy of Co—Pt or Co—Pt—Cr.

Figure 7:
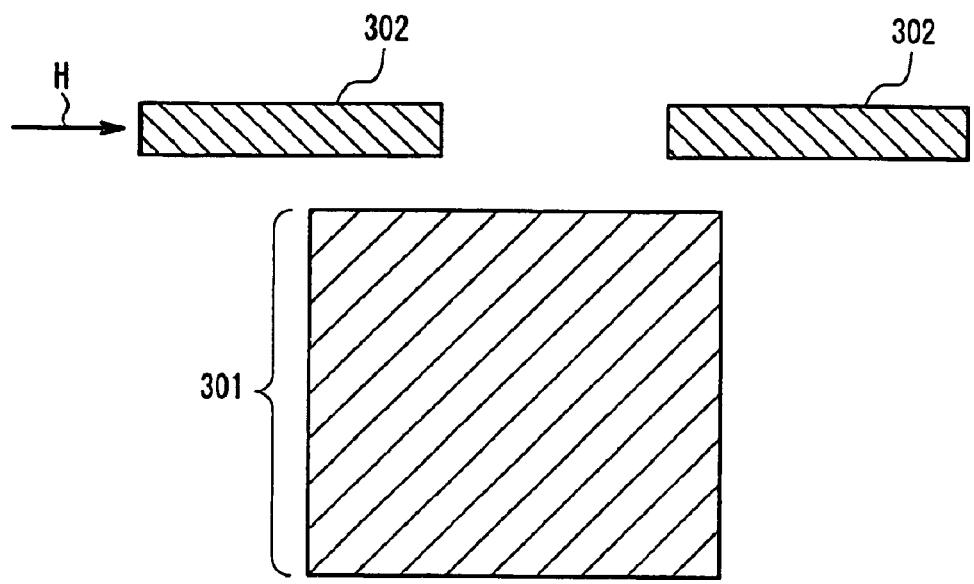
FIG. 7 is a cross-sectional view showing another example of the magnetic head of the present invention.

FIG. 7 shows another example of the magnetic head using the MR element of the present invention. The magnetic head shown in FIG. 7 includes yokes 302 as a magnetic flux guiding portion for guiding a magnetic field to be detected by the MR element to a MR element 301. Inclusion of the above-described MR element of the present invention as the MR element 301 makes it possible to achieve a magnetic head with excellent properties and thermal stability.

The yokes 302 may be disposed, for example, such that magnetic field H is guided to the free magnetic layer of the MR element (the side of the MR element 301 that is closer to the yokes 302 serves as the free magnetic layer in the example shown in FIG. 7). The yokes 302 also may be the free magnetic layer of the MR element 301 (or a part of the same).

Figure 8A:
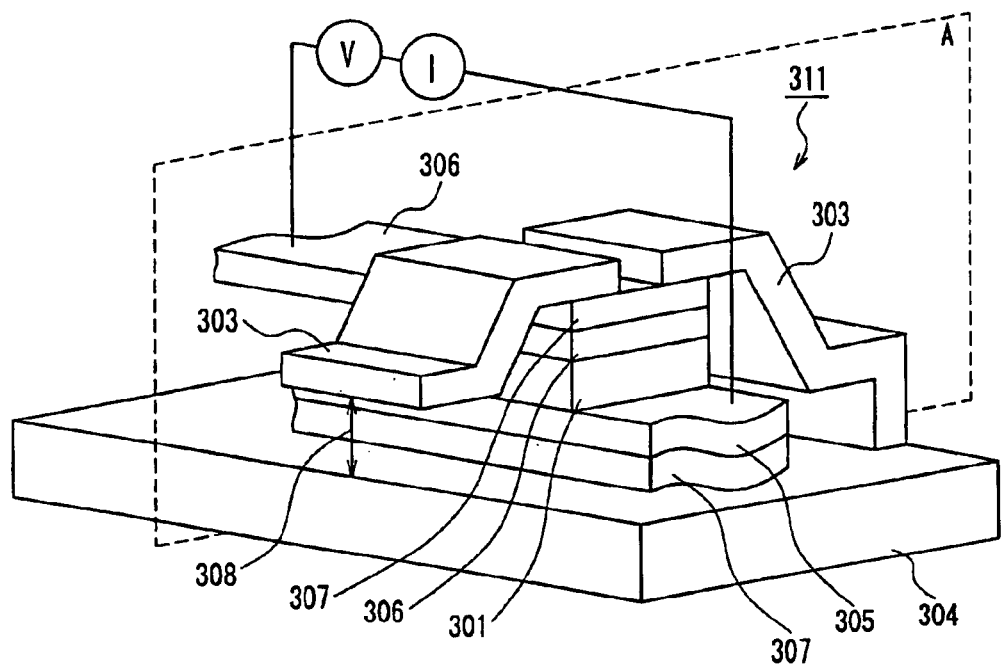
FIG. 8A is a schematic view showing yet another example of the magnetic head of the present invention.
Figure 8B:
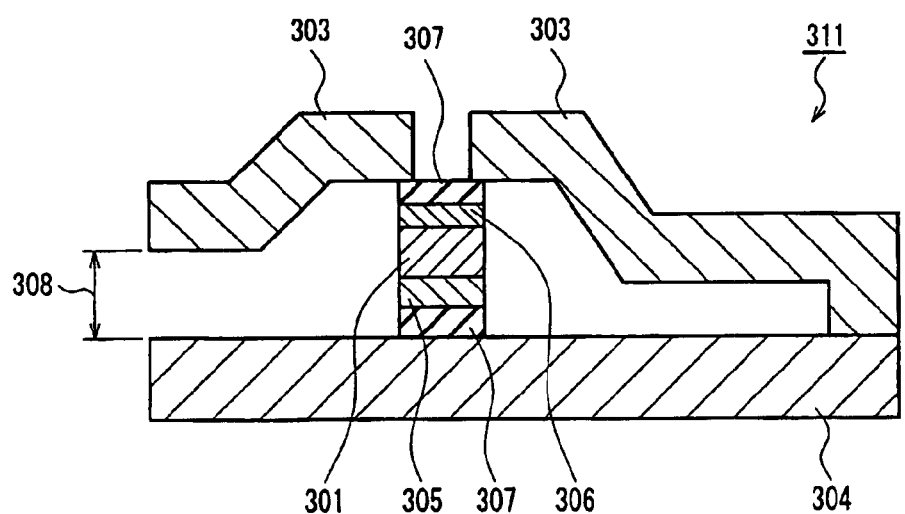
FIG. 8B is a cross-sectional view obtained by cutting the magnetic head shown in FIG. 8A on plane A shown in FIG. 8A.

FIGS. 8A and 8B show yet another example of the magnetic head using the MR element of the present invention. FIG. 8B is a cross-sectional view obtained by cutting a magnetic head 311 shown in FIG. 8A on plane A shown in FIG. 8A. The magnetic head 311 shown in FIGS. 8A and 8B includes yokes (an upper yoke 303 and a lower yoke 304) as a magnetic flux guiding portion for guiding a magnetic field to be detected by the MR element 301 to the MR element 301. The MR element 301 is disposed such that the upper yoke 303 and the lower yoke 304 are magnetically connected to the MR element 301. At this time, inclusion of the above-described MR element of the present invention as the MR element 301 makes it possible to achieve a magnetic head with excellent properties and thermal stability.

In the magnetic head 311 shown in FIGS. 8A and 8B, the magnetic field from a recording medium is guided from a read gap 308 to the MR element 301 by the upper yoke 303. In the case of the example shown in FIGS. 8A and 8B, the MR element 301 is electrically connected to an upper electrode layer 306 and a lower electrode layer 305, so that the resistance value of the element can be detected by applying a voltage to the element from the upper and lower electrode layers.

In the example shown in FIGS. 8A and 8B, the upper yoke 303 and the lower yoke 304 are electrically insulated from the MR element 301 by an insulating portion 307. The insulating portion 307, however, is not always necessary, and the upper yoke 303 and the lower yoke 304 also may serve as the upper electrode layer 306 and the lower electrode layer 305, respectively. The MR element 301 may be disposed, for example, such that its free magnetic layer is on the upper yoke 303 side. Additionally, the size of the read gap 308 is, for example, in the range of at least 0.0 1 m and at most 10 $\mu$m.

As the materials of the upper yoke 303 and the lower yoke 304, common soft magnetic materials such as Fe—Si—Al, Ni—Fe, Ni—Fe—Co, Co—Nb—Zr, Co—Ta—Zr or Fe—Ta—N may be used. Among them, soft magnetic materials with excellent magnetic permeability are preferable. For the insulating portion 307, a material with excellent insulating properties such as $Al_2O_3$, AlN or $SiO_2$ may be used.

In general, a magnetic head including yokes as shown in FIGS. 8A and 8B (yoke type magnetic head) is inferior in sensitivity to a magnetic head including shields as shown in FIG. 6 (shield type magnetic head); however, it is more advantageous in terms of narrowing the gaps, because there is no need to dispose the MR element in the read gap. That is, it is a magnetic head capable of higher density magnetic recording. Moreover, since the MR element is not exposed to a recording medium, less breakage and wear are caused on the head by the contact between the recording medium and the magnetic head, resulting in higher reliability. Therefore, it can be said that the yoke type magnetic head is superior, especially when used for a streamer using a magnetic tape as the recording medium.

Figure 9:
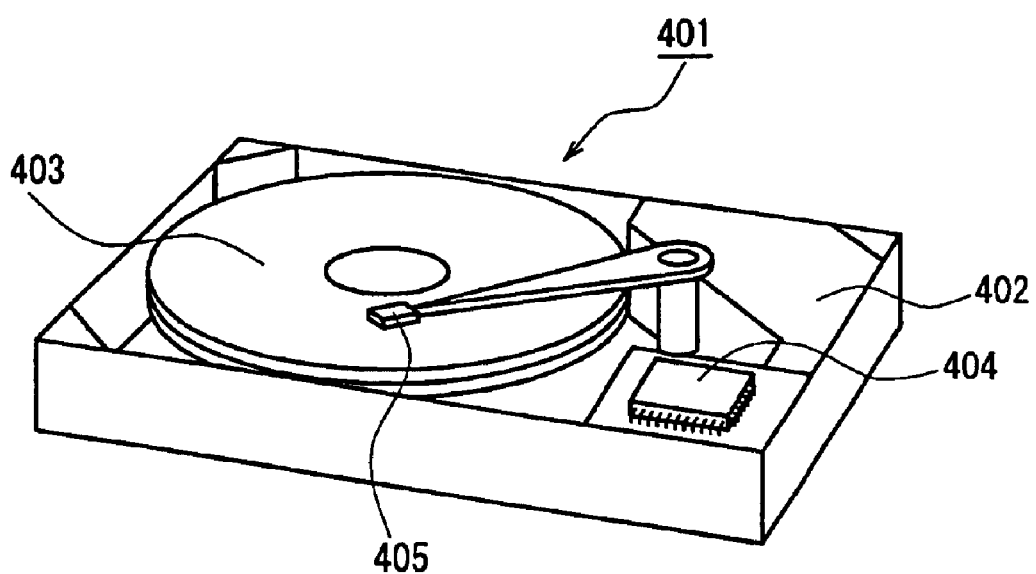
FIG. 9 is a schematic view showing an example of the magnetic recording device of the present invention.

Magnetic recording devices such as a hard disk drive (HDD) and a streamer can be configured by using the above-described magnetic head of the present invention. FIG. 9 shows an example of the magnetic recording device of the present invention. A magnetic recording device 401 shown in FIG. 9 includes a magnetic head 405, a driving portion 402, a magnetic recording medium 403 in which information is recorded, and a signal processing portion 404. At this time, use of the above-described magnetic head as the magnetic head 405 makes it possible to achieve a magnetic recording device with excellent properties and thermal stability.

Figure 10A:
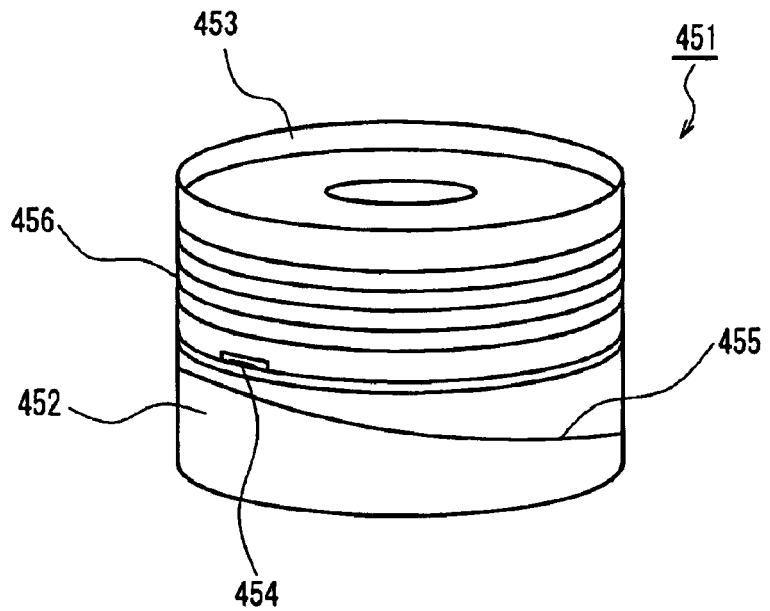
FIGS. 10A and 10B are schematic views showing another example of the magnetic recording device of the present invention.
Figure 10B:
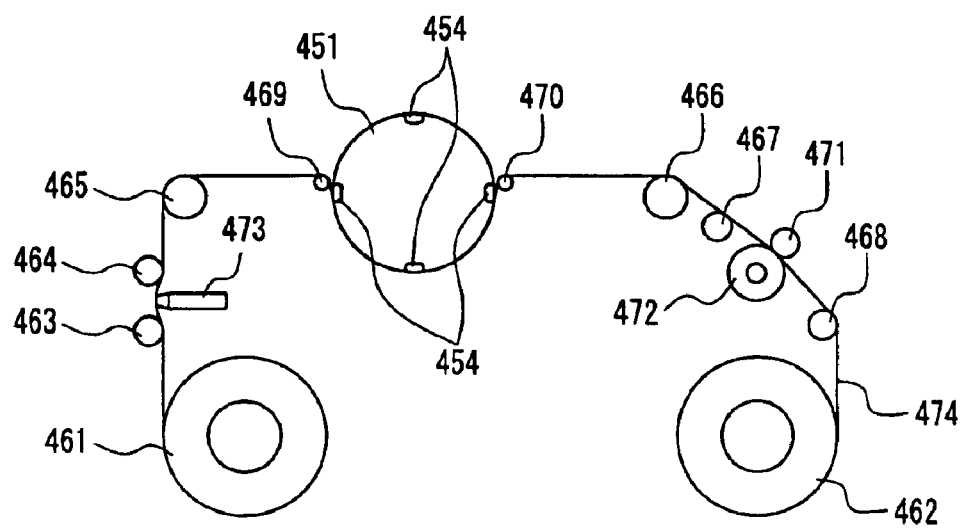

FIGS. 10A and 10B show another example of the magnetic recording device of the present invention. FIGS. 10A and 10B are schematic views showing an example of the magnetic recording device using a magnetic tape as the recording medium. More specifically, FIG. 10A is a schematic view showing an example of the rotary drum head in an example of the magnetic recording device of the present invention.

A rotary drum head 451 shown in the FIG. 10A includes a lower drum 452 and an upper rotary drum 453, and magnetic heads 454 are disposed on the outer circumferential surface of the upper rotary drum 453. At the time of recording and reading information, the magnetic tape serving as the recording medium may be run along a lead 455 at an angle inclined with respect to the rotation axis of the upper rotary drum 453. As a result, the magnetic heads 454 slide, maintaining the angle at which they are inclined with respect to the running direction of the magnetic tape. In order to allow the upper rotary drum 453 and the magnetic tape to slide and run stably while keeping them in close contact with one another, a plurality of grooves 456 are formed on the outer circumferential surface of the upper rotary drum 453. The air and the like caught between the magnetic tape and the upper rotary drum 453 can be discharged from these grooves 456.

FIG. 10B shows an example of the magnetic recording device using such a rotary drum head. The magnetic recording device shown in FIG. 10B includes the rotary drum head 451, a supply reel 461, a take-up reel 462, rotary posts 463, 464, 465, 466, 467 and 468, inclined posts 469 and 470, a capstan 471, a pinch roller 472 and a tension arm 473. As described above, the magnetic heads 454 are disposed on the outer circumferential surface of the rotary drum head 451. Of the magnetic heads 454, two magnetic heads for reading (the remaining two are for recording) are disposed so as to protrude by, for example, about 20 μm from the outer circumferential surface of the rotary drum. A magnetic tape 474 wound around the supply reel 461 can run by the lead-in operation with the pinch roller 472 and the capstan 471. The magnetic tape 474 that has started from the supply reel 461 is guided by the inclined posts 469 and 470 and pressed against the magnetic heads 454 disposed on the rotary drum head 451, and reading and/or recording is performed. The magnetic tape 474 on which reading and/or recording has been performed at the magnetic heads 454 passes between the pinch roller 472 and the capstan 471, and can be wound around the take-up reel 462.

At this time, use of the above-described MR element of the present invention as the magnetic heads 454 makes it possible to achieve a magnetic recording device with excellent properties and thermal stability.

Further, use of a yoke type magnetic head as shown in FIG. 8 as the magnetic heads 454 (especially as the magnetic heads 454 for reading) can suppress the change in shape of the MR element due to wear and the like, which is a problem in a helical scan method as shown in FIGS. 10A and 10B. Moreover, it is possible to suppress electrostatic breakdown of the MR element caused by the contact and sliding of the magnetic tape, the corrosion of the MR element caused by the reaction with the chemical substances contained in the magnetic tape or the atmosphere and the like, so that it is possible to achieve a more reliable magnetic recording device.

Figure 11:
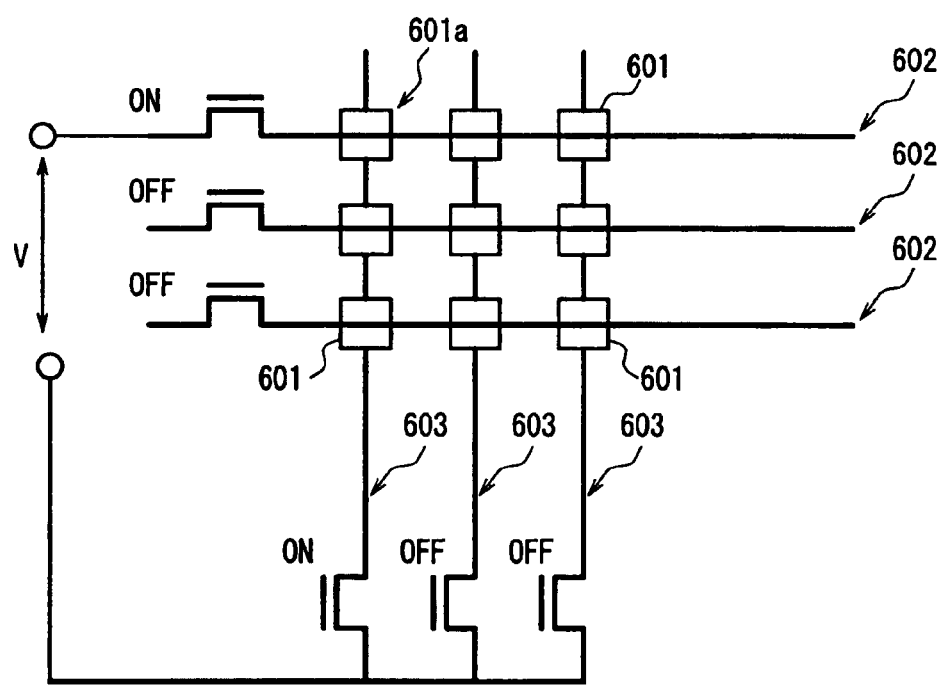
FIG. 11 is a schematic view showing an example of the magnetic memory of the present invention.

Next, FIG. 11 shows an example of the magnetic memory (MRAM) using the MR element of the present invention as the memory element. In the MRAM shown in FIG. 11, MR elements 601 are disposed in the form of a matrix at the intersection points between bit (sense) lines 602 and word lines 603 that are made of Cu, Al or the like. The bit line and the word line correspond to an information reading conductive line and an information recording conductive line, respectively. With a compound magnetic field generated at the time of passing a signal current through these lines, a signal is recorded in the MR elements 601. The signal is recorded in the elements (MR elements 601a in FIG. 11) disposed at positions where the lines in the "ON" state intersect (two current matching system). Use of the above-described MR element of the present invention as the MR elements 601 makes it possible to achieve a MRAM with excellent properties and thermal stability (e.g., with a small bias voltage dependence, that is, capable of producing high output).

Figures 12A, 12B:
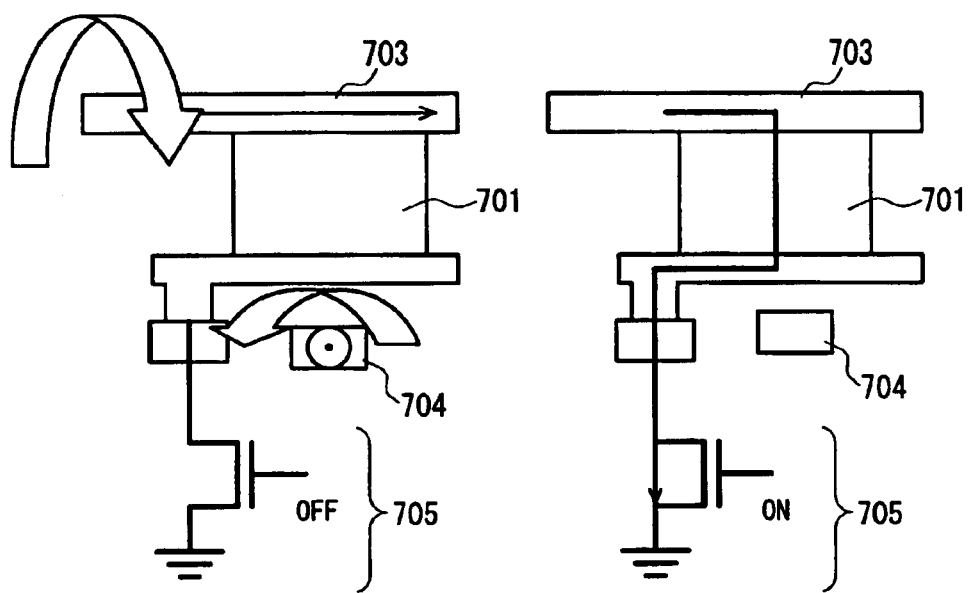
FIGS. 12A and 12B are schematic views showing basic examples of the operations in the magnetic memory of the present invention.
Figures 13A, 13B:
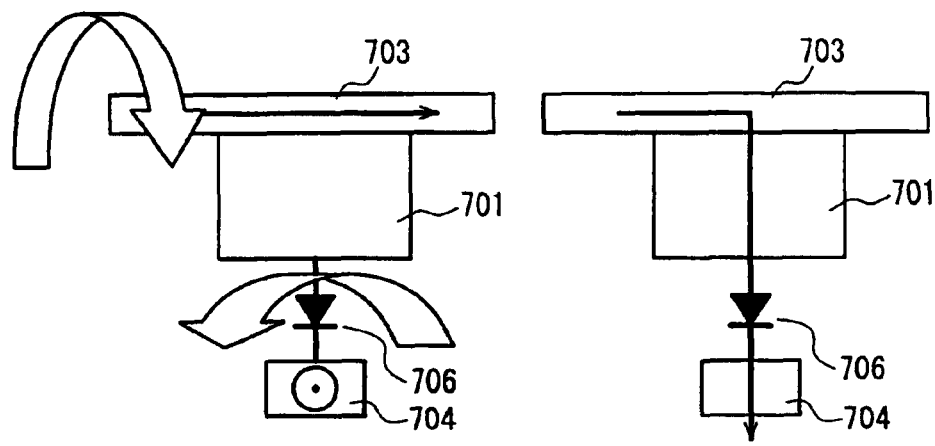
FIGS. 13A and 13B are schematic views showing basic examples of the operations in the magnetic memory of the present invention.
Figures 14A, 14B:
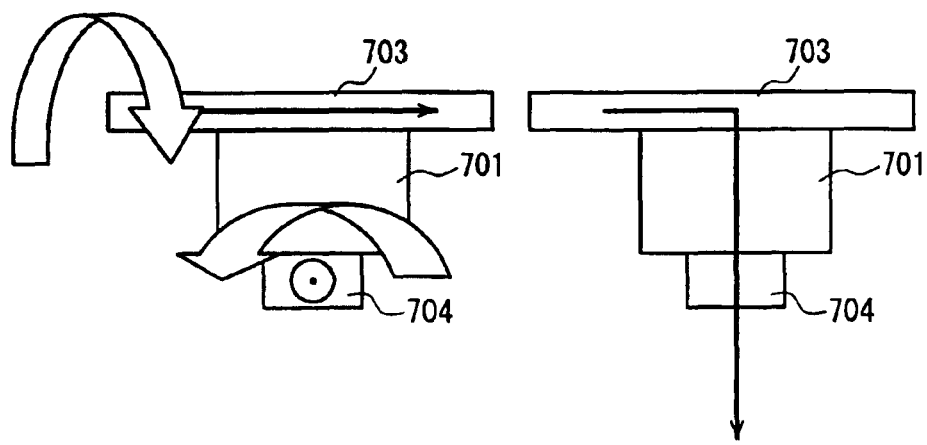
FIGS. 14A and 14B are schematic views showing basic examples of the operations in the magnetic memory of the present invention.

The operations of the MRAM are described in more detail with reference to FIGS. 12A to 14B. FIGS. 12A, 13A and 14A show basic examples of the writing operation. On the other hand, FIGS. 12B, 13B and 14B show basic examples of the reading operation. MR elements 701 are the above-described MR elements of the present invention.

In the MRAM shown in FIGS. 12A and 12B, in order to read the magnetization state of the MR elements 701 individually, a switching element 705 such as a FET is disposed for each of the elements. This MRAM is suitable for production on CMOS substrates. In the MRAM shown in FIGS. 13A and 13B, a nonlinear element 706 is provided for each of the elements. As the nonlinear element 706, it is possible to use for example, a varistor, a tunnel element, the above-described three terminal element or the like. It is also possible to use a rectifying element in place of the nonlinear element. This MRAM can be formed on a low cost glass substrate by using the film forming process for diodes. In the MRAM shown in FIGS. 14A and 14B, the MR elements 701 are disposed directly at the intersection points between word lines 704 and bit lines 703, without using a switching element or a nonlinear element as shown in FIGS. 12A to 13B. As a result, a current is passed through a plurality of elements at the time of reading in the case of this MRAM, so that it is preferable, in terms of the reading accuracy, to limit the number of the elements to at most 10000, for example.

In the MRAMs shown in FIGS. 12A to 14B, the bit lines 703 are also used as the sense lines that pass a current through the elements and read the change in resistance. However, the sense lines may be disposed separately from the bit lines, in order to prevent the malfunction and the breakdown of the elements caused by a bit current. In this case, it is preferable to dispose the bit lines in parallel with respect to the sense lines, while keeping the electrical insulation with the elements. Additionally, the spacing between the MR element and each of the world lines and the sense lines may be, for example, at most 500 nm, in terms of the power consumption at the time of writing.

EXAMPLES

The present invention is described below in further detail according to examples. However, the present invention is not limited to the following examples.

TMR elements with the film structures described in the examples are produced on substrates (3 inch φ) by DC and RF magnetron sputtering, and their MR properties were evaluated.

The magnetic resistance measurement for obtaining the MR ratio was performed by a DC four-terminal method, while applying an external magnetic field of $8 \times 10^4$ A/m (1 kOe) at the maximum in the same direction as the direction of the easy axis of magnetization of the pinned layer of each element. The MR ratio was calculated by the following Equation (1), taking the maximum resistance value as $R_{max}$ and the minimum resistance value as $R_{min}$, each of which was obtained by the magnetic resistance measurement.

$$MR \text{ ratio} = \{(R_{max} - R_{min})/R_{min}\} \times 100 (\%) \quad (1)$$

In addition, $R_{min}$ (Ω)×element area (μm$^2$) was taken as the junction resistance value (Ω·μm$^2$) of the elements. At this time, in order to correct the variations in junction resistance value caused by the element size (e.g., element area), the leakage current in the tunneling layer and the like, elements having different element areas (e.g., three types of elements having element areas of 1 $\mu m^2$, 10 $\mu m^2$ and 100 $\mu m^2$, (the film structure and the like are the same for all of the elements)) were prepared to obtain their respective junction resistance values, and the average value was used. The element area refers to the area of the element when viewed from its film plane direction. The element size refers to the size of the element when viewed from its film plane direction.

The crystal structure of each of the layers such as the third magnetic layer was evaluated by X-ray diffraction (XRD). For example, whether the (111) plane in the third magnetic layer was grown in parallel with respect to its own film plane was confirmed by whether any diffraction peak corresponding to the crystal plane (111) was present in the results of the XRD and the integrated intensity thereof was larger than the integrated intensities of other diffraction peaks. More specifically, it was determined that the (111) plane in the third magnetic layer was grown in parallel with respect to its own film plane and the third magnetic layer has good orientation and crystallinity in the (111) direction, when the rocking curve half width of the diffraction peaks corresponding to the crystal plane (111) was 10° or less. Whether the third magnetic layer had the fcc structure or the fct structure was also evaluated by XRD. A technique commonly used in a reflective wide angle X-ray diffraction (WAXD) was used for the XRD measurement. For a closer examination, a measurement to cause X-rays to be reflected directly on the film plane of a layer to be measured was also carried out.

Example 1

Si substrate with a thermally oxidized film/Ta (3)/Pt (100)/Ta (3)/Ni$_{0.8}$Fe$_{0.2}$ (3)/X/Al—O (0.5)/Co$_{0.75}$Fe$_{0.25}$ (3)/Ir$_{0.8}$Mn$_{0.2}$ (10)

Here, the numerical values in the parentheses represent the film thickness. The unit is nm, and the film thickness is hereinafter represented in the same manner. However, the value of Al—O is the design film thickness value (total value) of Al prior to oxidation. Al—O was produced by forming an Al film in a thickness of at least 0.1 nm and at most 0.5 nm, and thereafter repeating a one-minute oxidation at room temperature in an atmosphere containing oxygen of 26.3 kPa (200 Torr) (natural oxidation).

As the substrate, a Si substrate with a thermally oxidized film (thickness of the thermally oxidized film: 500 nm) was used. Ta (3)/Pt (100)/Ta (3) on the substrate is a lower electrode layer. Ni$_{0.8}$Fe$_{0.2}$ (3) is a first magnetic layer, Co$_{0.75}$Fe$_{0.25}$ (3) is a second magnetic layer, Ir$_{0.8}$Mn$_{0.2}$ (10) is an antiferromagnetic layer, and the MR element in Example 1 is a spin valve MR element having the second magnetic layer as the pinned magnetic layer.

X is a third magnetic layer made of a magnetic material having a composition as shown in the following TABLE 1. In Example 1, one sample (Sample A) that did not contain X as the comparative example and three samples (Samples 1—1 to 1-3) as the examples were prepared.

The film formation of each sample was performed in a chamber evacuated to a pressure of $1.3 \times 10^{-6}$ Pa ($1 \times 10^{-8}$ Torr) or lower. For each sample, Ta (15)/Pt (10) was laminated on the antiferromagnetic layer, as a part of an upper electrode layer serving also as a protective layer. Thereafter, each sample was microfabricated in a mesa shape as shown in FIG. 5 by photolithography and ion milling, and after forming Al$_2$O$_3$ as an interlayer insulating film by sputtering, a through hole was formed in the upper portion, on which an upper electrode made of Ta (3)/Cu (500)/Pt (10) was formed, thereby producing a MR element. The element size was 2 $\mu$m×4 $\mu$m for all the samples. The produced MR elements were subjected to heat treatment for three hours at 250° C. in a magnetic field of $4.0 \times 10^5$ A/m (5 kOe) (in a vacuum of $1.3 \times 10^{-3}$ Pa or lower).

After the heat treatment, the MR ratio as the MR properties of each sample was determined, and the junction resistance value of each sample was determined.

TABLE 1 shows the resulting MR ratios (%) and junction resistance values ($\Omega \cdot \mu m^2$) for the samples, together with the compositions and the thickness of X in the samples.

TABLE 1

| sample | X: composition (thickness) | MR ratio (%) | junction resistance value ($\Omega \cdot \mu m^2$) |
|---|---|---|---|
| A (Comparative Example) | none | 12 | 6 |
| 1-1 | Fe$_{0.6}$Pd$_{0.4}$ (3) | 23 | 7 |
| 1-2 | Fe$_{0.2}$Ni$_{0.7}$Au$_{0.1}$ (2) | 25 | 6 |
| 1-3 | Fe$_{0.35}$Co$_{0.35}$Pt$_{0.3}$ (1.5) | 30 | 4 |

As shown in TABLE 1, Sample A, in which X was not disposed, yielded an MR ratio of only about 12%, although having a junction resistance value as small as 6 $\Omega \cdot \mu m^2$. In addition, when the thickness of the Al—O layer was doubled to 1 nm in Sample A, the MR ratio increased to 31%; however, the junction resistance value greatly increased to 600 $\Omega \cdot \mu m^2$. This shows that the junction resistance value and the MR ratio are difficult to attain at the same time.

In contrast, Samples 1-1, 1-2 and 1-3, in each of which X was disposed, all had a junction resistance value of 10 $\Omega \cdot \mu m^2$ or less, while yielding a MR ratio as large as 20% or more. This shows that the disposition of X between the first magnetic layer and the tunnel insulating layer achieved a TMR element with excellent properties. In addition, when the same measurement was carried out by varying the size of the elements, no significant element size dependency was observed, and similar results were obtained in the case of, for example, the sample with an element size of 0.1 $\mu$m×0.1 $\mu$m.

Next, the cross-sectional structure of each sample was evaluated with a transmission electron microscope (TEM).

A roughness as shown in FIGS. 2A and 2B, presumably resulting from the crystal grain growth of Pt, was observed on the respective interfaces of Ta (3)/Pt (100)/Ta (3) serving as the lower electrode layer of each sample. The shape was such that "d" was about 20 nm and "h" was about 2 nm, using the periodicity d and the height h shown in FIGS. 2A and 2B.

In the case of Sample A, the same roughness as that observed on the lower electrode layer was observed also on the interface of each of the layers in the MR element.

By contrast, in the case of each of Samples 1-1 to 1-3, although the same roughness as that observed on the lower electrode layer was observed on the interface between the first magnetic layer and the third magnetic layer, no such roughness was observed on the interface between the third magnetic layer and the tunnel insulating layer and the interface was smooth. Furthermore, the surface of each of the layers laminated on the tunnel insulating layer was also smooth, proving that the disposition of the third magnetic layer X improved the smoothness of the interface between the tunnel insulating layer and the first magnetic layer and resulted in the formation of a tunnel insulating layer having a uniform thickness.

Additionally, the crystal structure of the third magnetic layer X was evaluated for Samples 1-1 to 1-3 by XRD upon the formation of a tunnel insulating layer made of Al—O. As a result, in the case of Samples 1-1 to 1-3, the crystal structure of the third magnetic layer X was a crystal structure showing the (111) orientation in parallel with respect to its own film plane In the case of Samples 1-1 and 1-2, the crystal structure of the third magnetic layer X was a face-centered cubic crystal structure (fcc structure), whereas in the case of Sample 1-3, the crystal structure of the third magnetic layer X was a face-centered tetragonal crystal structure (fct structure). In the results of the XRD measurement on the third magnetic layer X for Samples 1-1 to 1-3, the rocking curve half width of the diffraction peaks corresponding to the crystal plane (111) was 10° or less for all the samples.

In addition, similar results were obtained also when the composition ratios of the first magnetic layer, the second magnetic layer and the antiferromagnetic layer were different.

Example 2

Si single crystal substrate/Ag (5)/Cu (100)/$Ni_{0.8}Fe_{0.2}$ (4)/X/Al—O (2)/$Co_{0.5}Fe_{0.5}$ (3)/$Co_{0.5}Pt_{0.5}$ (10)

As the substrate, a Si single crystal substrate (crystal orientation plane: (111)) was used. Ag (5)/Cu (100) on the substrate is a lower electrode layer. The lower electrode layer was grown epitaxially on the substrate made of Si single crystal, and (111) oriented parallel to its own film plane.

$Ni_{0.8}Fe_{0.2}$ (4) is a first magnetic layer, and $Co_{0.5}Fe_{0.5}$ (3) is a second magnetic layer. $Co_{0.5}Pt_{0.5}$ (10) is a high coercive force layer made of a magnetic material with high coercive force, and the second magnetic layer adjacent thereto can serve as a pinned magnetic layer. Accordingly, the MR element in Example 2 is a spin valve MR element having the second magnetic layer as the pinned magnetic layer.

Al—O (2) is a tunnel insulating layer, which was formed by plasma oxidation, after forming an Al layer in a thickness of 2 nm. The plasma oxidation was performed by generating an oxygen plasma by supplying an RF power of 150 W to a one-turn coil in a mixed gas of Ar and $O_2$ whose oxygen partial pressure was adjusted to 75% of the total pressure (total pressure: 0.1 Pa (0.8 mTorr)) with an oxidation time of 180 seconds.

X is a third magnetic layer made of a magnetic material having each of the compositions shown in the following TABLE 2. In Example 2, one sample (Sample B) that did not contain X as the comparative example and three samples (Samples 2-1 to 2-3) as the examples were prepared.

The film formation of each sample was performed in the same manner as in Example 1. For each sample, Ta (15)/Pt (10) was laminated on the high coercive force layer, as a part of an upper electrode layer serving also as a protective layer. Thereafter, each sample was microfabricated in a mesa shape in the same manner as in Example 1, and after forming an interlayer insulating film made of $Al_2O_3$, a through hole was formed in the upper portion, on which an upper electrode made of Ta (3)/Cu (500)/Pt (10) was formed, thereby producing a MR element. The element size was 1 μm×3 μm for all the samples. The produced MR elements were subjected to heat treatment for 10 hours at 200° C. in a magnetic field of $4 \times 10^5$ A/m (5 kOe) (in a vacuum of $1.3 \times 10^{-3}$ Pa or lower).

After the heat treatment, the MR ratio was measured as the MR properties of each sample, and the bias voltage dependence of each sample was evaluated. The bias voltage dependence was evaluated by first obtaining a MR ratio when the bias voltage was approximately 0 (e.g., 50 mV or lower) and then determining a bias voltage ($V_h$) when the MR ratio was half the initial value by applying a bias voltage to the element. It is believed that the greater the value $V_h$, the smaller the bias voltage dependence of the element is.

For each of the samples of Example 2, before forming the tunnel insulating layer, the arithmetical mean roughness ($R_a$) of the plane of the magnetic layer on which the tunnel insulating layer was to be formed (i.e., the surface of the third magnetic layer X in the case of Samples 2-1 to 2-3, and the surface of the first magnetic layer in the case of Sample B) was evaluated with an atomic force microscope (AFM). The AFM measurement was performed in the chamber used for the film formation while maintaining the reduced pressure, without exposing each sample to the atmosphere. When the crystal structure of the third magnetic layer X in Samples 2-1 to 2-3 was analyzed by XRD as in Example 1, the crystal structure of the third magnetic layer X was a crystal structure showing the (111) orientation in parallel with respect to its own film plane in each of the samples.

TABLE 2 shows the measurement results of $V_h$ (mV) and $R_a$ (nm), together with the compositions and the thickness of X in the samples.

TABLE 2

| sample | X: composition (thickness) | $V_h$ (mV) | $R_a$ (nm) |
|---|---|---|---|
| B (Comparative Example) | none | 550 | 1.5 |
| 2-1 | $Fe_{0.65}Ni_{0.15}Pt_{0.2}$ (2) | 940 | 0.4 |
| 2-2 | $Fe_{0.2}Ni_{0.7}Au_{0.1}$ (5) | 850 | 0.6 |
| 2-3 | $Fe_{0.05}Co_{0.55}Ag_{0.4}$ (1.5) | 790 | 0.5 |

As shown in TABLE 2, in the case of Samples 2-1 to 2-3, in each of which X was provided, $V_h$ was greater, that is, the bias voltage dependence was smaller, as compared with Sample B, in which X was not provided. Moreover, it was found that in the case of Samples 2-1 to 2-3, the degree of surface roughness on the plane of the magnetic layer on which the tunnel insulating layer was formed was smaller, as compared with Sample B. Therefore, it is believed that providing X can reduce the roughness on the interface between the tunnel insulating layer and the magnetic layer adjacent thereto, the variation in thickness of the tunnel insulating layer, etc.

In addition, similar results were obtained also when the composition ratios of the first magnetic layer, the second magnetic layer and the high coercive force layer were different.

Example 3

Sample C (Comparative Example): Si substrate with a thermally oxidized film/Ta (3)/Cu (100)/Ta (3)/$Ni_{0.8}Fe_{0.2}$ (6)/Al—O (1.2)/$Co_{0.5}Fe_{0.5}$ (3)/$Ir_{0.8}Mn_{0.2}$ (12)

Sample 3-1: Si substrate with a thermally oxidized film/Ta (3)/Cu (100)/Ta (3)/Ni—Fe—Cr (4)/$Pt_{0.5}Mn_{0.5}$ (15)/$Co_{0.75}Fe_{0.25}$ (4)/$Fe_{0.75}Pt_{0.25}$ (2)/Al—O (0.7)/$Co_{0.9}Fe_{0.1}$ (2)/$Ni_{0.8}Fe_{0.2}$ (4)

Sample 3-2: Si substrate with a thermally oxidized film/Ta (3)/Cu (100)/Ta (3)/Ni—Fe—Cr (4)/$Ir_{0.8}Mn_{0.2}$ (10)/$Co_{0.9}Fe_{0.1}$ (4)/$Fe_{0.6}Pd_{0.4}$ (2)/Al—N (1.4)/$Ni_{0.6}Fe_{0.4}$ (5)

Sample 3-3: Si substrate with a thermally oxidized film/Ta (3)/Cu (100)/Ta (3)/Ni—Fe—Cr (4)/$Pt_{0.5}Mn_{0.5}$ (20)/$Co_{0.75}Fe_{0.25}$ (3)/Ru (0.8)/$Co_{0.75}Fe_{0.25}$ (1)/$Fe_{0.6}Ni_{0.15}Pt_{0.25}$ (2)/Al—O (1.0)/$Fe_{0.6}Ni_{0.15}Pt_{0.25}$ (2)/$Co_{0.9}Fe_{0.1}$ (5)

As the substrate, a Si substrate with a thermally oxidized film (thickness of the thermally oxidized film: 500 nm) was used. Ta (3)/Cu (100)/Ta (3) on the substrate is a lower electrode. Ni—Fe—Cr (4) in Samples 3-1 to 3-3 is an underlayer.

In Sample C, $Ni_{0.8}Fe_{0.2}$ (6) is a first magnetic layer, $Co_{0.5}Fe_{0.5}$ (3) is a second magnetic layer, and $Ir_{0.8}Mn_{0.2}$ (12) is an antiferromagnetic layer. Sample C is a spin valve MR element having the second magnetic layer as the pinned magnetic layer.

In Sample 3-1, $Pt_{0.5}Mn_{0.5}$ (15) is an antiferromagnetic layer, $Co_{0.75}Fe_{0.25}$ (4) is a first magnetic layer, $Fe_{0.75}Pt_{0.25}$ (2) is a third magnetic layer, and $Co_{0.9}Fe_{0.1}$ (2)/$Ni_{0.8}Fe_{0.2}$ (4) is a second magnetic layer. Sample 3-1 is a spin valve MR element having the first magnetic layer and the third magnetic layer as the pinned magnetic layers.

In Sample 3-2, $Ir_{0.8}Mn_{0.2}$ (10) is an antiferromagnetic layer, $Co_{0.9}Fe_{0.1}$ (4) is a first magnetic layer, $Fe_{0.6}Pd_{0.4}$ (2) is a third magnetic layer, and $Ni_{0.6}Fe_{0.4}$ (5) is a second magnetic layer. Sample 3-2 is a spin valve MR element having the first magnetic layer and the third magnetic layer as the pinned magnetic layers.

In Sample 3-3, $Pt_{0.5}Mn_{0.5}$ (20) is an antiferromagnetic layer, $Co_{0.75}Fe_{0.25}$ (3)/Ru (0.8)/$Co_{0.75}Fe_{0.25}$ (1) is a first magnetic layer including a laminated ferrimagnetic structure, $Fe_{0.6}Ni_{0.15}Pt_{0.25}$ (2) is a third magnetic layer, and $Fe_{0.6}Ni_{0.15}Pt_{0.25}$ (2)/$Co_{0.9}Fe_{0.1}$ (5) is a second magnetic layer. Sample 3-3 is a spin valve MR element having the first magnetic layer and the third magnetic layer as the pinned magnetic layers.

Al—O (1.2) serving as the tunnel insulating layer of Sample C was formed by plasma oxidation, after forming an Al layer in a thickness of 1.2 nm. The plasma oxidation was performed by generating an oxygen plasma by supplying an RF power of 150 W to a one-turn coil in a mixed gas of Ar and $O_2$ whose oxygen partial pressure was adjusted to 75% of the total pressure (total pressure: 0.1 Pa (0.8 mTorr)) with an oxidation time of 30 seconds.

Al—O (0.7) serving as the tunnel insulating layer of Sample 3-1 was formed by natural oxidation (for one minute) in pure oxygen of 26.3 kPa (200 Torr), after forming an Al layer in a thickness of 0.7 nm.

Al—N (1.4) serving as the tunnel insulating layer of Sample 3-2 was formed by plasma nitriding, after forming an Al layer in a thickness of 1.4 nm. The plasma nitriding was performed by generating an nitrogen plasma by supplying an RF power of 200 W to a one-turn coil in a mixed gas of Ar and $N_2$ whose nitrogen partial pressure was adjusted to 80% of the total pressure (total pressure: 0.1 Pa (0.8 mTorr)) with a nitriding time of 40 seconds.

Al—O (1.0) serving as the tunnel insulating layer of Sample 3-3 was formed by natural oxidation, after forming an Al layer. However, it was formed by multi-step oxidation in which Al (0.4) was laminated and oxidized first, then Al (0.3) was laminated thereon and oxidized, and Al (0.3) was further laminated and oxidized. That is, the tunnel insulating layer of Sample 3-3 is presumed to be a multilayer film of Al—O (0.4)/Al—O (0.3)/Al—O (0.3). The oxidation conditions were all the same for each of the steps, and the oxidation was performed for one minute (at room temperature) in an atmosphere containing oxygen of 26.3 kPa (200 Torr).

The film formation of each sample was performed in the same manner as in Example 1. For each sample, Ta (15)/Pt (10) was laminated on the second magnetic layer, as a part of an upper electrode layer serving also as a protective layer. Thereafter, each sample was microfabricated in a mesa shape as in Example 1, and after forming an interlayer insulating film made of $Al_2O_3$, a through hole was formed in the upper portion, on which an upper electrode made of Cu (500)/Pt (100) was formed, thereby producing a MR element. The element size was 0.1 μm×0.2 μm for all the samples. The produced MR elements were subjected to heat treatment for 8 hours at 280° C. in a magnetic field of $4\times10^5$ A/m (5 kOe) (in a vacuum of $1.3\times10^{-3}$ Pa or lower).

In Example 3, the degree of roughness on the surface of each layer, (e.g., the surface of the lower electrode layer when the lower electrode layer is laminated, and the surface of the third magnetic layer when the third magnetic layer is laminated) was first evaluated in the film formation process of the element with an AFM. As in Example 2, the AFM measurement was performed while maintaining the reduced pressure, without exposing each sample to the atmosphere.

For each sample, a roughness presumably attributed to the crystal grains of Cu was observed on the surface of the lower electrode layer at the stage of the lamination of the lower electrode layer. With the periodicity d and the height h shown in FIGS. 2A and 2B, "d" was about 55 nm, and "h" was about 6 nm. The size of the periodicity d was about the same level as the size of the crystal grains of Cu obtained from the results of the XRD measurement on the Cu layer included in the lower electrode layer. The size of the crystal grains of Cu was calculated by analyzing the half width of the diffraction peaks corresponding to the crystal plane of Cu obtained by the XRD measurement, using the Scherrer equation.

TABLE 3 shows the values of the height h of the surface of the antiferromagnetic layer at the stage of the lamination of the antiferromagnetic layer, and the surface of the third magnetic layer at the stage of the lamination of the third magnetic layer. It should be noted that for Sample C, the value of the height h of the surface of the first magnetic layer at the stage of the lamination of the first magnetic layer is shown in the column of the third magnetic layer.

TABLE 3

| | h (nm) | |
| --- | --- | --- |
| sample | antiferromagnetic layer | third magnetic layer |
| C (Comparative Example) | — | 5 |
| 3-1 | 1.5 | 0.5 |
| 3-2 | 1.7 | 0.6 |
| 3-3 | 1.4 | 0.6 |

As shown in TABLE 3, the degrees of roughness on the surfaces of the antiferromagnetic layers in Samples 3-1 to 3-3 were such that "h" was about 1.4 nm to 1.7 nm. This indicates that the disposition of the underlayer and the antiferromagnetic layer between the lower electrode layer and the first magnetic layer reduced the roughness (h=6 nm) observed on the surface of the lower electrode layer. Presumably, the degrees of roughness on the surfaces of the first magnetic layers in Samples 3-1 to 3-3 are such that "h" is about 1.5 nm, as with the case of the surfaces of the antiferromagnetic layers. Additionally, the disposition of the third magnetic layer reduced the degrees of roughness on the surfaces of the third magnetic layers to about 0.5 nm, showing that the surfaces were smoothed further. In contrast, the degree of roughness on the surface of the first magnetic layer in Sample C was about the same as the degree of roughness on the surface of the lower electrode layer. It is believed that the surface roughness of the lower electrode directly influences the surface of the first magnetic layer.

As a result of evaluating the crystal structures of the antiferromagnetic layers and the third magnetic layers in Samples 3-1 to 3-3 by XRD, it was confirmed that they each had the fcc structure or the fct structure and were (111) oriented parallel to their own film planes. Additionally, the underlayers had the fcc structure.

Next, in order to examine the thermal stability of each of the MR elements produced in the above-described manner, each sample was subjected to heat treatment at 280° C. to 450° C., and the MR ratio after the heat treatment was determined. The heat treatment was performed by holding each sample for 0.5 hour at the respective temperatures shown in TABLE 4. In addition, the magnetic resistance measurement for obtaining the MR ratio was performed after cooling the heat-treated elements to room temperature. The results are shown in TABLE 4.

TABLE 4

| sample | MR ratio after heat treatment at respective temperatures (%) | | | | | |
|---|---|---|---|---|---|---|
| | 280° C. | 300° C. | 350° C. | 370° C. | 400° C. | 450° C. |
| C | 28 | 30 | 16 | 5 | 2 | 0 |
| 3-1 | 35 | 38 | 35 | 34 | 33 | 32 |
| 3-2 | 26 | 25 | 24 | 22 | 24 | 22 |
| 3-3 | 45 | 46 | 45 | 44 | 44 | 42 |

As shown in TABLE 4, Samples 3-1 to 3-3, in each of which the underlayer and the antiferromagnetic layer were disposed between the lower electrode layer and the first magnetic layer, and the third magnetic layer was disposed between the first magnetic layer and the tunnel insulating layer, exhibited better thermal stability than Sample C.

In addition, similar results were obtained also when the composition ratios of the first magnetic layer, the second magnetic layer and the antiferromagnetic layer were different.

Example 4

Shield type magnetic heads as shown in FIG. 6 were produced using the MR elements (Sample 1-3 and Sample A) produced in Example 1, and their properties were evaluated.

An $Al_2O_3$—TiC substrate was used as the substrate of the magnetic heads, and a $Ni_{0.8}Fe_{0.2}$ alloy was used for the upper recording core, upper shield and lower shield. A laminated film of Cu, Pt and Ta was used for the electrode layers (the upper electrode layer and lower electrode layer) sandwiching the MR element, and a portion of the upper shield and a portion of the lower shield were used as the upper electrode layer and the lower electrode layer, respectively.

Anisotropy was provided for the MR elements in such a manner that the easy direction of magnetization of the magnetic layer corresponding to the free magnetic layer was perpendicular to the direction of a signal magnetic field to be detected (i.e., in the track width direction), and that the magnetization direction of the magnetic layer corresponding to the pinned magnetic layer was in parallel with respect to the direction of a signal magnetic field to be detected. Such an anisotropy was provided by first defining the magnetization direction of the pinned magnetic layer by a heat treatment in a magnetic field (280° C., $4.0×10^5$ A/m (5 kOe)) and then defining the easy direction of magnetization of the free magnetic layer by a heat treatment in a magnetic field (200° C., $8.0×10^3$ A/m (100 Oe)), after producing the MR elements. The size of the MR elements was 0.5 μm×0.5 μm, which corresponds to the track width and the MR height, respectively. The read gap of the magnetic head was 0.1 μm.

As a result of evaluating the S/N ratios (signal-to-noise ratios) of the magnetic heads thus produced, the S/N ratios of the magnetic head including Sample 1-3 was improved by 8 dB, as compared with the magnetic head including Sample A.

Example 5

Yoke type magnetic heads as shown in FIGS. 8A and 8B were produced, and their properties were evaluated.

A Ni—Fe alloy film with high magnetic permeability was used for the lower yoke. After the lower yoke was formed, its surface was polished by CMP, and an insulating portion made of $Al_2O_3$ and a lower electrode layer made of a laminated film of Ta/Cu/Ta were formed thereon, followed by forming MR elements with the film structures shown below. For the formation of the MR elements, the same methods as in Example 1 were used.

Sample 5-1: $Pt_{0.5}Mn_{0.5}$ (15)/$Co_{0.75}Fe_{0.25}$ (3)/Ru (0.8)/$Co_{0.75}Fe_{0.25}$ (1)/$Fe_{0.6}Ni_{0.15}Pt_{0.25}$ (2)/Al—O (0.7)/$Fe_{0.6}Ni_{0.15}Pt_{0.25}$ (1)/$Ni_{0.8}Fe_{0.2}$ (2)

Sample E (Comparative Example): $Pt_{0.5}Mn_{0.5}$ (15)/$Co_{0.75}Fe_{0.25}$ (3)/Ru (0.8)/$Co_{0.75}Fe_{0.25}$ (3)/Al—O (0.7)/$Co_{0.9}Fe_{0.1}$ (1)/$Ni_{0.8}Fe_{0.2}$ (2)

$Pt_{0.5}Mn_{0.5}$ (15) is an antiferromagnetic layer, and $Co_{0.75}Fe_{0.25}$ (3)/Ru (0.8)/$Co_{0.75}Fe_{0.25}$ (1) is a first magnetic layer including a laminated ferrimagnetic structure. $Fe_{0.6}Ni_{0.15}Pt_{0.25}$ (2) and $Fe_{0.6}Ni_{0.15}Pt_{0.25}$ (1) in Sample 5-1 are third magnetic layers. Additionally, in Sample 5-1, Ni—Fe—Cr (4) was laminated between the lower electrode layer and the antiferromagnetic layer as the underlayer of the antiferromagnetic layer.

For the both samples, the Al—O layer serving as the tunnel insulating layer was formed by natural oxidation for 10 minutes in pure oxygen of 26.3 kPa (200 Torr), after laminating an Al layer in a thickness of 0.7 nm. The size of the MR elements was 2 μm×6 μm.

At the time of producing the magnetic head, the element was disposed such that the long side of the element was perpendicular to the plane A shown in FIG. 8A. In addition, a laminated film made of Ta/Pt/Cu was used for the upper electrode layer, and an insulating layer made of $SiO_2$ was formed between the upper electrode layer and the upper yoke in order to prevent electric short circuits. For the upper yoke, a soft magnetic film made of Cu—Mo—Ni—Fe was used.

As in Example 4, anisotropy was provided for the MR elements in such a manner that the easy direction of magnetization of the magnetic layer corresponding to the free magnetic layer was perpendicular to the direction of a signal magnetic field to be detected (in a direction perpendicular to the plane A shown in FIG. 8A) and that the magnetization direction of the magnetic layer corresponding to the pinned magnetic layer was in parallel with respect to the direction of a signal magnetic field to be detected (in a direction parallel with respect to the plane A shown in FIG. 8A). However, the magnetic field of the heat treatment in a magnetic field for defining the easy direction of magnetization of the free magnetic layer was 4×10⁴ A/m (500 Oe). In addition, the length of the read gap of the magnetic head was 0.5 μm.

A test was performed, in which each of the magnetic heads produced in the above-described manner was placed in a constant temperature bath at 180° C., and held there for 50 days with a voltage of 200 mV applied to the MR element, and the MR outputs before and after the test were compared. The following method was used for the measurement of the MR outputs.

The magnetic head was placed in a Helmholtz coil, and, while applying a current to the MR element, the magnetic resistance obtained at this time was measured by a DC four-terminal method. At the time of measuring the magnetic resistance, the magnetic field for measurement was varied within the range of ±4.0×10⁴ A/m. The difference between the maximum value and the minimum value of the magnetic resistance thus obtained was taken as the MR output of the magnetic head. The direction of the magnetic field for measurement to be generated by the Helmholtz coil was the easy direction of magnetization of the pinned magnetic layer of the MR element.

As a result of evaluation, the magnetic head using Sample E as the MR element had an output decrease as great as about 38% before and after the test. In contrast, the magnetic head using Sample 5-1 as the MR element had an output decrease within about 1% before and after the test, and exhibited very stable output characteristics after the test.

In addition, similar results were obtained also when the composition ratios of the first magnetic layer, the second magnetic layer and the high coercive force layer were different.

Example 6

Magnetic memories (MRAMs) including no switching element as shown in FIGS. 14A and 14B were produced, using the MR elements (Sample 3-1, Sample 3-3 and Sample C) produced in Example 3. However, the thickness of the tunnel insulating layer of Sample 3-1 was 1.2 nm, and the thickness of the tunnel insulating layer of Sample 3-2 was 1.4 nm.

The MRAMs were produced as follows. First, a word line made of Cu was formed on a Si substrate having a thermally oxidized firm of 500 nm, and an insulating film made of Al₂O₃ was formed on the surface. Subsequently, a lower electrode layer made of Cu was formed. At this time, the surface of the lower electrode layer was smoothed by CMP, and then the MR element with the film structure of Sample 3-1, Sample 3-3 or Sample C was laminated. The size of the MR elements was 1 μm×2 μm.

Next, the produced MR elements were subjected to a heat treatment in a magnetic field at 280° C. and 4.0×10⁵ A/m (5 kOe) for 5 hours. The magnetic field was applied in the direction of the long side of the elements. Thereafter, as in Example 1, the MR elements were formed by microfabricating the samples in a mesa shape. Finally, a bit line made of Cu was formed as an upper electrode layer, thereby producing a single magnetic memory element including no switching element as shown in FIGS. 14A and 14B.

A magnetic field was applied to the produced magnetic memory by passing a current through the word line and the bit line so as to reverse the magnetization direction of the free magnetic layer of the MR element, thus recording a "0".

Next, a magnetic field was applied by passing a current through the word line and the bit line in a direction opposite to that of the previous current so as to reverse the magnetization direction of the free magnetic layer, thus recording a "1". Then, a sense current was supplied to the MR elements in the respective states by applying a bias voltage (about 400 mV) thereto, and the difference in the element voltages in the states of "0" and "1"; as a result, the magnetic memories including the MR elements of Samples 3-1 and 3-3 yielded an output of 100 mV or more. On the other hand, in the case of the magnetic memory including the MR element of Sample C, the output was less than 100 mV, although it was possible to read the "0" and the "1". The reason is presumably that the bias voltage dependence of the MR elements of Samples 3-1 and 3-3 is smaller than that of the MR element of Sample C.

Next, the above-described MR elements were disposed on CMOS substrates, and integrated magnetic memories in which the MR elements were disposed in the form of a matrix as shown in FIG. 11 were produced. The element arrangement included a total of 8 blocks, each block having a memory of 16×16 elements. The disposition of the MR elements was performed as follows. First, after disposing FETs serving as the switching elements in the form of a matrix on the CMOS substrate and smoothing the surface by CMP, the MR elements having the film structure of Sample 3-1, Sample 3-2 or Sample C were disposed in the form of a matrix in correspondence with the FETs. The size of the MR elements was 0.1 μm×0.25 μm.

After the disposition of the MR elements, heat treatment in a magnetic field (280° C., 4×10⁵ A/m (5 kOe), 10 hours) was performed first. The magnetic field was applied in the direction of the long side of the MR elements. Thereafter, hydrogen sintering was performed at 400° C. It should be noted that one element in each block was a dummy element for canceling the wiring resistance, the minimum element resistance, the FET resistance and the like. Additionally, Cu was used for all of the word lines and the bit lines.

An 8-bit signal was recorded on the thus produced magnetic memory by simultaneously performing the magnetization reversals of the free magnetic layers of 8 elements per each block by a synthetic magnetic field generated by the word lines and the bit lines. Next, the gate of the FET of one element per each block was turned ON to supply a sense current to the elements. At this time, the voltages generated in the bit line, the elements and the FETs in each block were compared with a dummy voltage by a comparator, and the outputs of the respective elements were read.

As a result of the measurement, the MRAM using Sample C as the MR element yielded no element output at all. On the other hand, the MRAMs using Samples 3-1 and 3-3 as the MR element yielded a good element output, as with the case of the above-described single magnetic memory. From this result, it can be said that Samples 3-1 and 3-3 had a sufficient thermal stability to heat treatment at 400° C., whereas Sample C was not able to withstand heat treatment at 400° C.

As described above, according to the present invention, it is possible to provide a TMR element with excellent properties and thermal stability and a method for producing such a TMR element. It is also possible to provide a magnetic head, a magnetic memory and a magnetic recording device that are excellent in properties and thermal stability.

The present invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a magnetoresistive element comprising a tunnel insulating layer, and a first magnetic layer and a second magnetic layer that are laminated so as to sandwich the tunnel insulating layer, wherein a resistance value varies depending on a relative angle between magnetization directions of the first magnetic layer and the second magnetic layer, the method comprising the steps of:

(i) laminating a first magnetic layer, a third magnetic layer and an Al layer successively on a substrate;

(ii) forming a tunnel insulating layer containing at least one compound selected from the group consisting of an oxide, nitride and oxynitride of Al by performing at least one reaction selected from the group consisting of oxidation, nitriding and oxynitriding of the Al layer;

(iii) forming a laminate comprising the first magnetic layer, the tunnel insulating layer and a second magnetic layer by laminating the second magnetic layer in such a manner that the tunnel insulating layer is sandwiched by the first magnetic layer and the second magnetic layer; and (iv) heat treating the laminate at not less than 350° C., wherein the third magnetic layer comprises a magnetic material containing at least one element selected from the group consisting of Fe, Co, and Ni, the magnetic material further contains at least one element selected from the group consisting of Rh, Pd, Ag, Ir, Pt, and Au, and the third magnetic layer has at least one crystal structure selected from the group consisting of a face-centered cubic crystal structure and a face-centered tetragonal crystal structure and is (111) oriented parallel to a film plane of the third magnetic layer.

2. The method for producing a magnetoresistive element according to claim 1, wherein the magnetic material has a composition represented by the formula $Fe_xCo_y$, where x and y are values satisfying the following equations:

$x+y=1$ $0.05 \leq x \leq 0.3$ $0.7 \leq y \leq 0.95$.

3. The method for producing a magnetoresistive element according to claim 1, wherein the magnetic material has a composition represented by the formula $Fe_{x'}Ni_{y'}$, where x' and y' are values satisfying the following equations:

$x'+y'=1$ $0 \leq x' \leq 0.7$ $0.3 \leq y' \leq 1$.

4. The method for producing a magnetoresistive element according to claim 1, wherein the magnetic material has a composition represented by the formula $M_pZ_q$, where M is at least one element selected from the group consisting of Fe, Co and Ni, Z is at least one element selected from the group consisting of Rh, Pd, Ag, Ir, Pt and Au, and p and q are values satisfying the following equations:

$p+q=1$ $0.6 \leq p \leq 0.99$ $0.01 \leq q \leq 0.4$.

5. The method for producing a magnetoresistive element according to claim 1, wherein an antiferromagnetic layer is laminated between the substrate and the first magnetic layer in the step (i).

* * * * *

UNITED STATES PATENT AND TRADEMARK OFFICE
CERTIFICATE OF CORRECTION

PATENT NO. : 6,943,041 B2
DATED : September 13, 2005
INVENTOR(S) : Sugita et al.

It is certified that error appears in the above-identified patent and that said Letters Patent is hereby corrected as shown below:

<u>Title page,</u>
Item [56], References Cited, U.S. PATENT DOCUMENTS, "9/1995 Suzuki et al." should read -- 8/1995 Suzuki et al. --.

Signed and Sealed this

Eleventh Day of April, 2006

JON W. DUDAS
*Director of the United States Patent and Trademark Office*